(12) United States Patent
Chan et al.

(10) Patent No.: US 9,024,692 B2
(45) Date of Patent: May 5, 2015

(54) VOLTAGE CONTROLLED OSCILLATOR BAND-SELECT FAST SEARCHING USING PREDICTIVE SEARCHING

(71) Applicant: QUALCOMM Incorporated, San Diego, CA (US)

(72) Inventors: Ngar Loong Alan Chan, San Jose, CA (US); Jeongsik Yang, Cupertino, CA (US); Sang-Oh Lee, Cupertino, CA (US)

(73) Assignee: Qualcomm Incorporated, San Diego, CA (US)

( * ) Notice: Subject to any disclaimer, the term of this patent is extended or adjusted under 35 U.S.C. 154(b) by 53 days.

(21) Appl. No.: 13/790,150

(22) Filed: Mar. 8, 2013

(65) Prior Publication Data
US 2014/0253255 A1    Sep. 11, 2014

(51) Int. Cl.
  H03L 7/10     (2006.01)
  H03L 7/113    (2006.01)
  H03L 7/16     (2006.01)
  H03J 5/24     (2006.01)

(52) U.S. Cl.
  CPC ........ *H03L 7/10* (2013.01); *H03L 7/113* (2013.01); *H03L 7/16* (2013.01); *H03J 5/244* (2013.01); *H03J 2200/10* (2013.01)

(58) Field of Classification Search
  CPC ............... H03L 7/07; H03L 7/16; H03L 7/18; H03L 7/099; H03L 7/113; H03J 5/244; H03J 2200/10
  USPC ...................... 331/16, 1 A, 4, 34, 44; 327/156
  See application file for complete search history.

(56) References Cited

U.S. PATENT DOCUMENTS

| 4,503,401 A | 3/1985 | Kyriakos et al. |
| 6,686,804 B1 * | 2/2004 | Adams et al. ............... 331/17 |
| 6,731,712 B1 | 5/2004 | Lindstrom et al. |
| 6,888,413 B1 | 5/2005 | Adams et al. |
| 7,082,177 B2 | 7/2006 | Arkiszewski |

(Continued)

FOREIGN PATENT DOCUMENTS

WO    0158018 A2    8/2001

OTHER PUBLICATIONS

Shin, et al., "A 1.9-3.8 GHz Fractional-N PLL Frequency Synthesizer With Fast Auto-Calibration of Loop Bandwidth and VCO Frequency", IEEE Journal of Solid-State Circuits, vol. 47, No. 3, Mar. 2012, pp. 665-675.

(Continued)

*Primary Examiner* — Ryan Johnson
(74) *Attorney, Agent, or Firm* — Toler Law Group, PC

(57) ABSTRACT

A method, an apparatus, and a computer program product are provided. The apparatus tunes a frequency provided by a VCO. The apparatus determines a relative capacitance change associated with a first frequency and a desired frequency from a look-up table. The apparatus adjusts a capacitor circuit in the VCO based on the determined relative capacitance change determined from the look-up table in order to tune from the first frequency to the desired frequency. The apparatus determines that the frequency provided by the VCO is a second frequency different than the desired frequency after adjusting the capacitor circuit. The apparatus performs an iterative search to further adjust the capacitor circuit when a difference between the second frequency and the desired frequency is greater than a threshold.

53 Claims, 19 Drawing Sheets

(56) References Cited

U.S. PATENT DOCUMENTS

| | | |
|---|---|---|
| 7,177,382 B2 | 2/2007 | Lindstrom et al. |
| 7,427,899 B2 * | 9/2008 | Lee .................................. 331/11 |
| 7,609,122 B2 | 10/2009 | Jian et al. |
| 7,907,020 B2 | 3/2011 | Wilson |
| 2003/0050029 A1 * | 3/2003 | Kaufmann et al. ............ 455/260 |
| 2009/0002079 A1 * | 1/2009 | Venuti et al. ..................... 331/10 |

OTHER PUBLICATIONS

Shin, Jaewook et al., "A Fast and High-Precision VCO Frequency Calibration Technique for Wideband Fractional-N Frequency Synthesizers," IEEE Transactions on Circuits and Systems, vol. 57, No. 7, Jul. 2010, pp. 1573-1582.

* cited by examiner

| Current Channel → Future Channel ↓ | 1 | 2 | 3 | 4 | 5 |
|---|---|---|---|---|---|
| 1 | NA | +4C*1.2 | +12C*1.2 | +20C*1.2 | +32C*1.2 |
| 2 | -4C*1.2 | NA | +4C*1.2 | +12C*1.2 | +20C*1.2 |
| 3 | -12C*1.2 | -4C*1.2 | NA | +4C*1.2 | +12C*1.2 |
| 4 | -20C*1.2 | -12C*1.2 | -4C*1.2 | NA | +4C*1.2 |
| 5 | -32C*1.2 | -20C*1.2 | -12C*1.2 | -4C*1.2 | NA |

FIG. 5

| Current Channel → Future Channel ↓ | 1 | 2 | 3 | 4 | 5 |
|---|---|---|---|---|---|
| 1 | NA | +4C | +12C | +20C | +32C |
| 2 | -4C | NA | +4C | +12C | +20C |
| 3 | -12C | -4C | NA | +4C | +12C |
| 4 | -20C | -12C | -4C | NA | +4C |
| 5 | -32C | -20C | -12C | -4C | NA |

FIG. 9

VOLTAGE CONTROLLED OSCILLATOR BAND-SELECT FAST SEARCHING USING PREDICTIVE SEARCHING

BACKGROUND

1. Field

The present disclosure relates generally to communication systems, and more particularly, to voltage controlled oscillator (VCO) band-select fast searching using predictive searching.

2. Background

A wireless device (e.g., a cellular phone or a smartphone) may transmit and receive data for two-way communication with a wireless communication system. The wireless device may include a transmitter for data transmission and a receiver for data reception. For data transmission, the transmitter may modulate a transmit local oscillator (LO) signal with data to obtain a modulated radio frequency (RF) signal, amplify the modulated RF signal to obtain an output RF signal having the desired output power level, and transmit the output RF signal via an antenna to a base station. For data reception, the receiver may obtain a received RF signal via the antenna, amplify and downconvert the received RF signal with a receive LO signal, and process the downconverted signal to recover data sent by the base station.

The wireless device may include one or more oscillators to generate one or more oscillator signals at one or more desired frequencies. The oscillator signal(s) may be used to generate the transmit LO signal for the transmitter and the receive LO signal for the receiver. The oscillator(s) may be required to generate the oscillator signal(s) to meet the requirements of the wireless communication system with which the wireless device communicates.

A VCO is used to generate the transmit LO signal and the receive LO signal. The VCO is tuned to a desired VCO frequency. Some applications may need a faster tuning speed with a reduced settling time of the VCO frequency. As such, there is a need for methods and apparatuses that improve a VCO tuning speed and reduce a settling time of the VCO frequency.

SUMMARY

In an aspect of the disclosure, a method, a computer program product, and an apparatus are provided. The apparatus tunes a frequency provided by a VCO. The apparatus determines a relative capacitance change associated with a first frequency and a desired frequency from a look-up table. The apparatus adjusts a capacitor circuit in the VCO based on the determined relative capacitance change determined from the look-up table in order to tune from the first frequency to the desired frequency. The apparatus determines that the frequency provided by the VCO is a second frequency different than the desired frequency after adjusting the capacitor circuit. The apparatus performs an iterative search to further adjust the capacitor circuit when a difference between the second frequency and the desired frequency is greater than a threshold.

BRIEF DESCRIPTION OF THE DRAWINGS

FIG. 5 is a diagram illustrating an adjustment to the relative look-up table.

FIG. 9 is a diagram for illustrating a multi-step process of using the relative look-up table.

DETAILED DESCRIPTION

Figure 1:
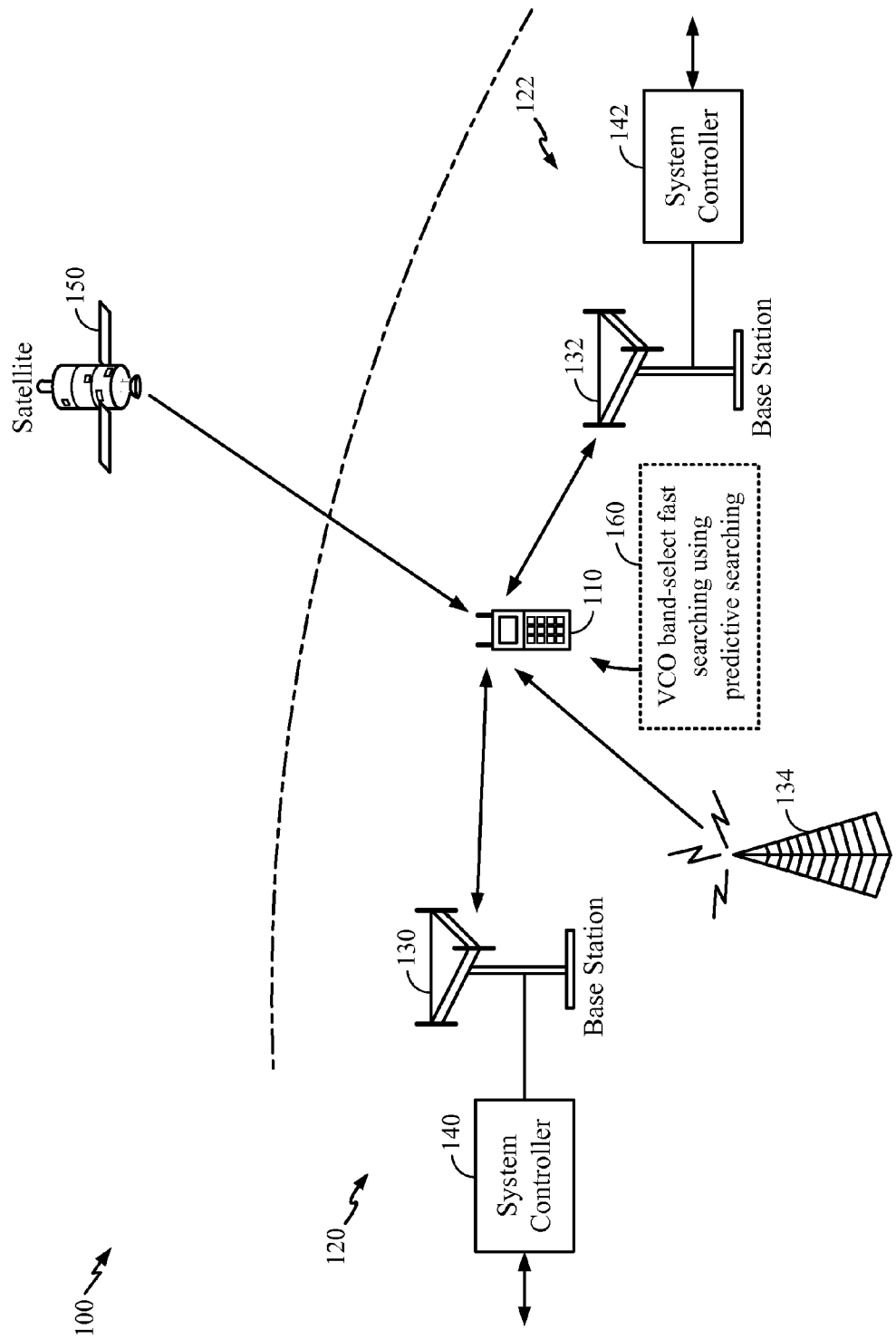
FIG. 1 illustrates a wireless device communicating with different wireless communication systems.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts. The term "exemplary" is used herein to mean "serving as an example, instance, or illustration." Any design described herein as "exemplary" is not necessarily to be construed as preferred or advantageous over other designs.

Several aspects of telecommunication systems will now be presented with reference to various apparatus and methods. These apparatus and methods will be described in the following detailed description and illustrated in the accompanying drawings by various blocks, modules, components, circuits, steps, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system.

By way of example, an element, or any portion of an element, or any combination of elements may be implemented with a "processing system" that includes one or more processors. Examples of processors include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise.

Accordingly, in one or more exemplary embodiments, the functions described may be implemented in hardware, software, firmware, or any combination thereof. If implemented in software, the functions may be stored on or encoded as one or more instructions or code on a computer-readable medium. Computer-readable media includes computer storage media. Storage media may be any available media that can be accessed by a computer. By way of example, and not limitation, such computer-readable media can comprise random-access memory (RAM), read-only memory (ROM), electronically erasable programmable ROM (EEPROM), compact disk (CD) ROM (CD-ROM), or other optical disk storage, magnetic disk storage or other magnetic storage devices, or any other medium that can be used to carry or store desired program code in the form of instructions or data structures and that can be accessed by a computer. Disk and disc, as used herein, includes CD, laser disc, optical disc, digital versatile disc (DVD), and floppy disk where disks usually reproduce data magnetically, while discs reproduce data optically with lasers. Combinations of the above should also be included within the scope of computer-readable media.

FIG. 1 is a diagram 100 illustrating a wireless device 110 communicating with different wireless communication systems 120, 122. The wireless systems 120, 122 may each be a Code Division Multiple Access (CDMA) system, a Global System for Mobile Communications (GSM) system, a Long Term Evolution (LTE) system, a wireless local area network (WLAN) system, or some other wireless system. A CDMA system may implement Wideband CDMA (WCDMA), CDMA 1X or cdma2000, Time Division Synchronous Code Division Multiple Access (TD-SCDMA), or some other version of CDMA. TD-SCDMA is also referred to as Universal Terrestrial Radio Access (UTRA) Time Division Duplex (TDD) 1.28 Mcps Option or Low Chip Rate (LCR). LTE supports both frequency division duplexing (FDD) and time division duplexing (TDD). For example, the wireless system 120 may be a GSM system, and the wireless system 122 may be a WCDMA system. As another example, the wireless system 120 may be an LTE system, and the wireless system 122 may be a CDMA system.

For simplicity, the diagram 100 shows the wireless system 120 including one base station 130 and one system controller 140, and the wireless system 122 including one base station 132 and one system controller 142. In general, each wireless system may include any number of base stations and any set of network entities. Each base station may support communication for wireless devices within the coverage of the base station. The base stations may also be referred to as a Node B, an evolved Node B (eNB), an access point, a base transceiver station, a radio base station, a radio transceiver, a transceiver function, a basic service set (BSS), an extended service set (ESS), or some other suitable terminology. The wireless device 110 may also be referred to as a user equipment (UE), a mobile device, a remote device, a wireless device, a wireless communications device, a station, a mobile station, a subscriber station, a mobile subscriber station, a terminal, a mobile terminal, a remote terminal, a wireless terminal, an access terminal, a client, a mobile client, a mobile unit, a subscriber unit, a wireless unit, a remote unit, a handset, a user agent, or some other suitable terminology. The wireless device 110 may be a cellular phone, a smartphone, a tablet, a wireless modem, a personal digital assistant (PDA), a handheld device, a laptop computer, a smartbook, a netbook, a cordless phone, a wireless local loop (WLL) station, or some other similar functioning device.

The wireless device 110 may be capable of communicating with the wireless system 120 and/or 122. The wireless device 110 may also be capable of receiving signals from broadcast stations, such as the broadcast station 134. The wireless device 110 may also be capable of receiving signals from satellites, such as the satellite 150, in one or more global navigation satellite systems (GNSS). The wireless device 110 may support one or more radio technologies for wireless communication such as GSM, WCDMA, cdma2000, LTE, 802.11, etc. The terms "radio technology," "radio access technology," "air interface," and "standard" may be used interchangeably.

The wireless device 110 may communicate with a base station in a wireless system via the downlink and the uplink. The downlink (or forward link) refers to the communication link from the base station to the wireless device, and the uplink (or reverse link) refers to the communication link from the wireless device to the base station. A wireless system may utilize TDD and/or FDD. For TDD, the downlink and the uplink share the same frequency, and downlink transmissions and uplink transmissions may be sent on the same frequency in different time periods. For FDD, the downlink and the uplink are allocated separate frequencies. Downlink transmissions may be sent on one frequency, and uplink transmissions may be sent on another frequency. Some exemplary radio technologies supporting TDD include GSM, LTE, and TD-SCDMA. Some exemplary radio technologies supporting FDD include WCDMA, cdma2000, and LTE. The wireless device 110 may employ VCO band-select fast searching using predictive searching 160. Exemplary methods and apparatuses employing VCO band-select fast searching using predictive searching are provided infra.

Figure 2:
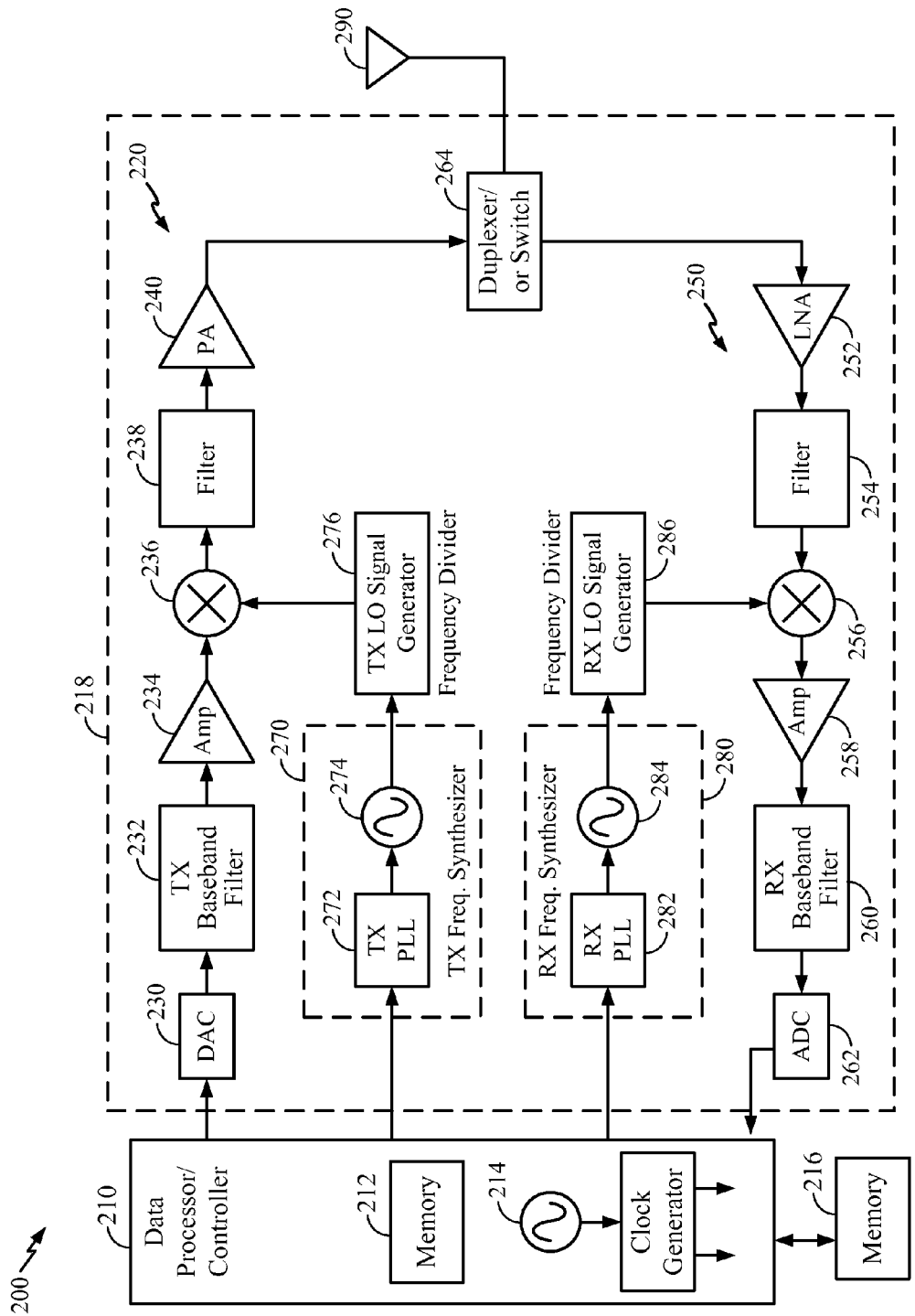
FIG. 2 is a block diagram of a wireless device.

FIG. 2 is a block diagram 200 of an exemplary wireless device, such as the wireless device 110. The wireless device includes a data processor/controller 210, a transceiver 218, and an antenna 290. The data processor/controller 210 may be referred to as a processing system. A processing system may include the data processor/controller 210 or both the data processor/controller 210 and the memory 216. The transceiver 218 includes a transmitter 220 and a receiver 250 that support bi-directional communication. The transmitter 220 and/or the receiver 250 may be implemented with a superheterodyne architecture or a direct-conversion architecture.

In the super-heterodyne architecture, a signal is frequency converted between RF and baseband in multiple stages, e.g., from RF to an intermediate frequency (IF) in one stage, and then from IF to baseband in another stage for a receiver. In the direct-conversion architecture, which is also referred to as a zero-IF architecture, a signal is frequency converted between RF and baseband in one stage. The super-heterodyne and direct-conversion architectures may use different circuit blocks and/or have different requirements. In the exemplary design shown in FIG. 2, the transmitter 220 and the receiver 250 are implemented with the direct-conversion architecture.

In the transmit path, the data processor/controller 210 may process (e.g., encode and modulate) data to be transmitted and provide the data to a digital-to-analog converter (DAC) 216. The DAC 216 converts a digital input signal to an analog output signal. The analog output signal is provided to a transmit (TX) baseband (lowpass) filter 232, which may filter the analog output signal to remove images caused by the prior digital-to-analog conversion by the DAC 216. An amplifier (amp) 234 may amplify the signal from the TX baseband filter 232 and provide an amplified baseband signal. An upconverter (mixer) 236 may receive the amplified baseband signal and a TX LO signal from a TX LO signal generator 276. The upconverter 236 may upconvert the amplified baseband signal with the TX LO signal and provide an upconverted signal. A filter 238 may filter the upconverted signal to remove images caused by the frequency upconversion. A power amplifier (PA) 240 may amplify the filtered RF signal from the filter 238 to obtain the desired output power level and provide an output RF signal. The output RF signal may be routed through a duplexer/switchplexer 264.

For FDD, the transmitter 220 and the receiver 250 may be coupled to the duplexer 264, which may include a TX filter for the transmitter 220 and a receive (RX) filter for the receiver 250. The TX filter may filter the output RF signal to pass signal components in a transmit band and attenuate signal components in a receive band. For TDD, the transmitter 220 and the receiver 250 may be coupled to switchplexer 264. The switchplexer 264 may pass the output RF signal from the transmitter 220 to the antenna 290 during uplink time intervals. For both FDD and TDD, the duplexer/switchplexer 264 may provide the output RF signal to the antenna 290 for transmission via a wireless channel.

In the receive path, the antenna 290 may receive signals transmitted by base stations and/or other transmitter stations and may provide a received RF signal. The received RF signal may be routed through duplexer/switchplexer 264. For FDD, the RX filter within the duplexer 264 may filter the received RF signal to pass signal components in a receive band and attenuate signal components in the transmit band. For TDD, the switchplexer 264 may pass the received RF signal from the antenna 290 to the receiver 250 during downlink time intervals. For both FDD and TDD, the duplexer/switchplexer 264 may provide the received RF signal to the receiver 250.

Within the receiver 250, the received RF signal may be amplified by a low noise amplifier (LNA) 252 and filtered by a filter 254 to obtain an input RF signal. A downconverter (mixer) 256 may receive the input RF signal and an RX LO signal from an RX LO signal generator 286. The downconverter 256 may downconvert the input RF signal with the RX LO signal and provide a downconverted signal. The downconverted signal may be amplified by an amplifier 258 and further filtered by an RX baseband (lowpass) filter 260 to obtain an analog input signal. The analog input signal is provided to an analog-to-digital converter (ADC) 262. The ADC 262 converts an analog input signal to a digital output signal. The digital output signal is provided to the data processor/controller 210.

A TX frequency synthesizer 270 may include a TX phase locked loop (PLL) 272 and a VCO 274. The VCO 274 may generate a TX VCO signal at a desired frequency. The TX PLL 272 may receive timing information from the data processor/controller 210 and generate a control signal for the VCO 274. The control signal may adjust the frequency and/or the phase of the VCO 274 to obtain the desired frequency for the TX VCO signal. The TX frequency synthesizer 270 provides the TX VCO signal to the TX LO signal generator 276. The TX LO signal generator may generate a TX LO signal based on the TX VCO signal received from the TX frequency synthesizer 270.

A RX frequency synthesizer 280 may include an RX PLL 282 and a VCO 284. The VCO 284 may generate an RX VCO signal at a desired frequency. The RX PLL 282 may receive timing information from the data processor/controller 210 and generate a control signal for the VCO 284. The control signal may adjust the frequency and/or the phase of the VCO 284 to obtain the desired frequency for the RX VCO signal. The RX frequency synthesizer 280 provides the RX VCO signal to the RX LO signal generator 286. The RX LO signal generator may generate an RX LO signal based on the RX VCO signal received from the RX frequency synthesizer 280.

The LO signal generators 276, 286 may each include frequency dividers, buffers, etc. The LO signal generators 276, 286 may be referred to as frequency dividers if they divide a frequency provided by the TX frequency synthesizer 270 and the RX frequency synthesizer 280, respectively. The PLLs 272, 282 may each include a phase/frequency detector, a loop filter, a charge pump, a frequency divider, etc. Each VCO signal and each LO signal may be a periodic signal with a particular fundamental frequency. The TX LO signal and the RX LO signal from the LO generators 276, 286 may have the same frequency for TDD or different frequencies for FDD. The TX VCO signal and the RX VCO signal from the VCOs 274, 284 may have the same frequency (e.g., for TDD) or different frequencies (e.g., for FDD or TDD).

The conditioning of the signals in the transmitter 220 and the receiver 250 may be performed by one or more stages of amplifier, filter, upconverter, downconverter, etc. These circuits may be arranged differently from the configuration shown in FIG. 2. Furthermore, other circuits not shown in FIG. 2 may also be used to condition the signals in the transmitter 250 and the receiver 220. For example, impedance matching circuits may be located at the output of the PA 240, at the input of the LNA 252, between the antenna 290 and the duplexer/switchplexer 264, etc. Some circuits in FIG. 2 may also be omitted. For example, the filter 238 and/or the filter 254 may be omitted. All or a portion of the transceiver 218 may be implemented on one or more analog integrated circuits (ICs), RF ICs (RFICs), mixed-signal ICs, etc. For example, the TX baseband filter 232 to the PA 240 in the transmitter 220, the LNA 252 to the RX baseband filter 260 in the receiver 250, the PLLs 272, 282, the VCOs 274, 284, and the LO signal generators 276, 286 may be implemented on an RFIC. The PA 240 and possibly other circuits may also be implemented on a separate IC or a circuit module.

The data processor/controller 210 may perform various functions for the wireless device. For example, the data processor/controller 210 may perform processing for data being transmitted via the transmitter 220 and received via the receiver 250. The data processor/controller 210 may control the operation of various circuits within the transmitter 220 and the receiver 250. The memory 212 and/or the memory 216 may store program codes and data for the data processor/controller 210. The memory may be internal to the data processor/controller 210 (e.g., the memory 212) or external to the data processor/controller 210 (e.g., the memory 216). The memory may be referred to as a computer-readable medium. An oscillator 214 may generate a VCO signal at a particular frequency. A clock generator 216 may receive the VCO signal from the oscillator 214 and may generate clock signals for various modules within the data processor/controller 210. The data processor/controller 210 may be implemented on one or more application specific integrated circuits (ASICs) and/or other ICs.

Figure 3B:
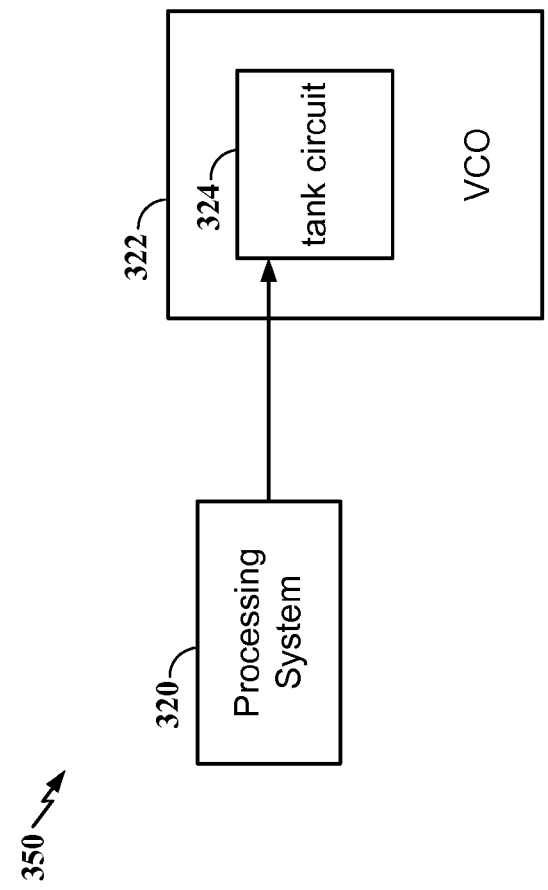
FIG. 3B is a diagram of a processing system interfacing with a VCO to adjust a tank circuit.
Figure 3A:
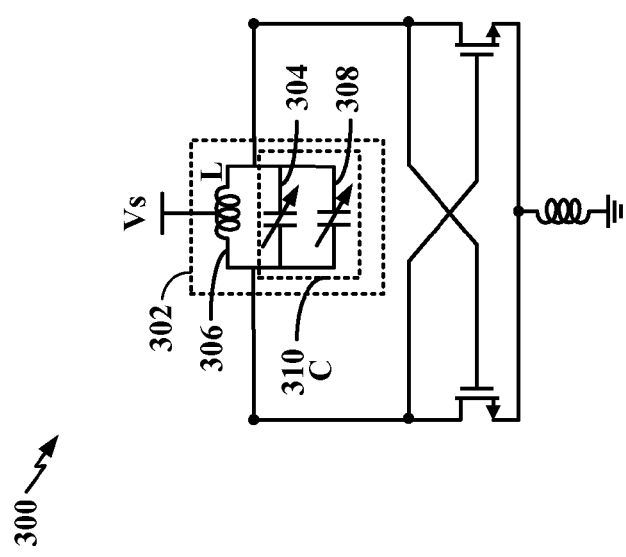
FIG. 3A is a diagram of an example of a VCO.

FIG. 3A is a diagram 300 of an example of a VCO. The wireless device 110 may employ a searching algorithm for adjusting a capacitor bank 304 within a capacitor circuit 310 within a tank circuit 302 of the VCO. The VCO corresponds to the VCO 274 and/or the VCO 284. The capacitor circuit 310 includes a capacitor bank 304, and may further include one or more varactors 308 for fine tuning the capacitance. The capacitor bank 304 may be binary-weighted or include a binary-weighted capacitor bank. An n-bit binary-weighted capacitor bank may include capacitors or sets of capacitors with unit capacitances of $C, 2C, 4C, \ldots, 2^nC$. The wireless device 110 adjusts the capacitor circuit 310 in order to tune a frequency provided by the VCO. Generally, a change in capacitance $\Delta C$ of the capacitor circuit 310 from an initial capacitance $C_i$ to a desired capacitance $C_d$ is related to the frequency provided by the VCO as follows:

$$\Delta C = \frac{1}{\omega_2^2 L} - \frac{1}{\omega_1^2 L},$$

where $\phi_i = 2\pi f_i$ for $i=1, 2$, $f_1$ is an initial frequency, $f_2$ is a desired frequency, L is the inductance of the parallel inductor 306, and $C_d = C_i + \Delta C$. Changing the frequency can take multiple steps. For example, a binary search, which has a worst case performance of $\log_2(N)$, may take 512 steps in total for a 9-bit capacitor bank. Some applications may need faster tuning with a reduced settling time of the VCO frequency. As such, there is a need for methods and apparatuses that improve a VCO tuning speed and reduce a settling time of the VCO frequency.

FIG. 3B is a diagram 350 of a processing system 320 interfacing with a VCO 322 to adjust a tank circuit 324. The processing system 320 is configured to tune a frequency provided by a VCO 322. Specifically, the processing system 320 is configured to determine a relative capacitance change associated with a first frequency and a desired frequency from a look-up table. The processing system 320 is configured to adjust a capacitor circuit within the tank circuit 324 in the VCO 322 based on the determined relative capacitance change determined from the look-up table in order to tune from the first frequency to the desired frequency. The processing system 320 is configured to determine that the frequency provided by the VCO 322 is a second frequency different than the desired frequency after adjusting the capacitor circuit. Further, the processing system 320 is configured to perform an iterative search to further adjust the capacitor circuit when a difference between the second frequency and the desired frequency is greater than a threshold.

Figure 4A:
FIG. 4A is a diagram of an exemplary look-up table.
Figure 4B:
FIG. 4B is a diagram of an exemplary relative look-up table.

FIG. 4A is a diagram 400 of an exemplary look-up table. FIG. 4B is a diagram 450 of an exemplary relative look-up table. In an exemplary method, when the wireless device 110 tunes the VCO 274 and/or the VCO 284 from an initial frequency to a desired frequency, the wireless device 110 determines a relative capacitance change associated with the initial frequency and the desired frequency from a look-up table. The look-up table may be pre-defined based on calculation or experiment and/or may be populated partially or in full by the wireless device 110 itself. The look-up table may include capacitances for a set of channels, as shown in FIG. 4A, or may include relative capacitance changes for a set of channels, as shown in FIG. 4B. The channels correspond to different VCO frequencies. The wireless device 110 utilizes one of the look-up tables to determine a relative capacitance change associated with changing from the initial frequency to the desired frequency. For example, referring to FIG. 4A, if the wireless device 110 is tuning a VCO from an initial frequency corresponding to channel 1 to a desired frequency corresponding to channel 5, the wireless device 110 may determine that the relative capacitance change $\Delta C$ is $-32C$ (i.e., 68C-100C). For another example, referring to FIG. 4B, the wireless device 110 may determine that the relative capacitance change $\Delta C$ is $-32C$ from the table entry 452. After determining the relative capacitance change $\Delta C$, the wireless device 110 adjusts a capacitor circuit (e.g., the capacitor bank 304) in the VCO based on the determined relative capacitance change $\Delta C$. Subsequently, after adjusting the capacitor circuit, the wireless device 110 determines that the frequency provided by the VCO is a second frequency different than the desired frequency. When the difference between the second frequency and the desired frequency is less than a threshold, the wireless device 110 adjusts a fine tuning capacitor circuit (e.g., the varactor(s) 308) in order to tune from the second frequency to the desired frequency. The threshold is based on a range of the fine tuning capacitor circuit. For example, if the fine tuning capacitor circuit has a range of 1C, the threshold may be 0.5C, or half of the range of the fine tuning capacitor circuit. A threshold of ½ the range of the fine tuning capacitor circuit would correspond to setting the fine tuning capacitor circuit initially to a middle of its range, thus allowing the fine tuning capacitor circuit to be adjusted up or down in capacitance by half of its range.

When the difference between the second frequency and the desired frequency is greater than the threshold, the wireless device 110 performs an iterative search (e.g., binary search, linear search, or other iterative search) to further adjust the capacitor circuit. The iterative search is performed with an initial capacitance value $C_0$, where $C_0 = C_i + \Delta C$. While performing the iterative search to further adjust the capacitor circuit, the wireless device 110 may determine that the frequency provided by the VCO is a third frequency that differs from the desired frequency by less than the threshold. The wireless device 110 then adjusts the fine tuning capacitor circuit (e.g., the varactor(s) 308) in order to tune from the third frequency to the desired frequency.

FIG. 5 is a diagram 500 illustrating an adjustment to the relative look-up table. If the look-up table is pre-defined, process variations in the capacitors of the capacitor circuit (e.g., the capacitor bank 304) may result in the look-up table having an offset for a particular frequency adjustment. In addition, an ambient operating temperature may affect the capacitances of each of the capacitors in the capacitor circuit. Further, as the capacitor circuit ages, degradation of the dielectric in each of the capacitors may cause the capacitance of each of the capacitors to decrease. Accordingly, the wireless device 110 may determine a process variation associated with the capacitor circuit, an ambient operating temperature of the capacitor circuit, and/or a variation in the capacitances of the capacitors in the capacitor circuit (e.g., due to dielectric degradation), and adjust the determined relative capacitance based on the determined process variation, ambient operating temperature, and/or capacitance variation.

The wireless device 110 may receive process variation information indicating the process variation and may adjust the look-up table values based on the received process variation information. For example, the wireless device 110 may receive process variation information indicating that the capacitors are about 1/1.2 (i.e., 0.833) times the original default C value. The wireless device 110 may then adjust the entries in the look-up table by multiplying by each entry by 1.2 to account for the received process variation. Alternatively or in addition, the wireless device 110 may have a built-in self test for determining a process variation of the capacitors in the capacitor circuit of the VCO. The wireless device 110 may adjust the look-up table values based on the results of the built-in self test.

Figures 6A, 6B:
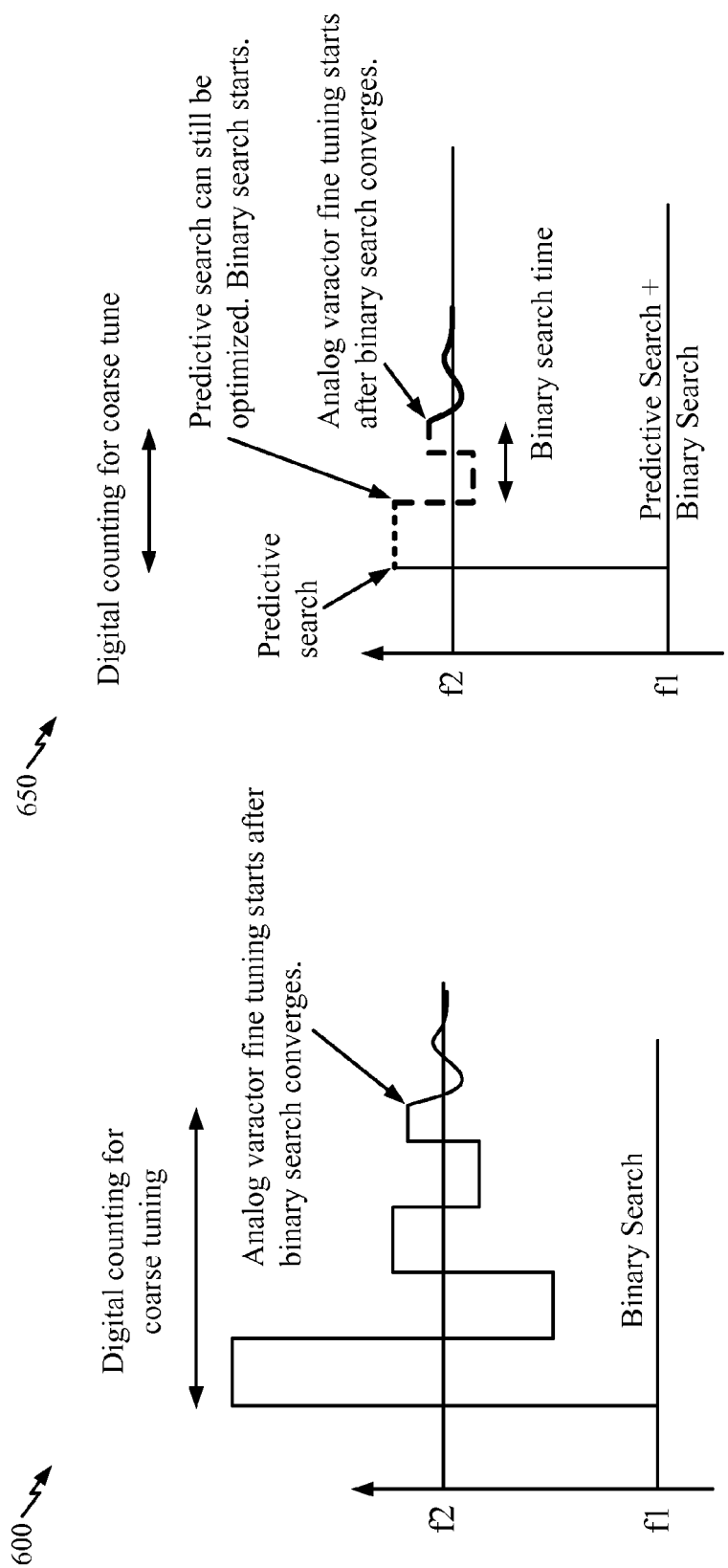
FIG. 6A is a diagram illustrating course tuning and fine tuning.
FIG. 6B is a diagram illustrating an exemplary course tuning and fine tuning.

FIG. 6A is a diagram 600 illustrating course tuning and fine tuning. FIG. 6B is a diagram 650 illustrating an exemplary course tuning and fine tuning. As shown in FIG. 6A, an iterative search, such as a binary search, may be performed on a binary-weighted capacitor bank for course tuning of the VCO frequency of a VCO. The iterative search may be referred to as digital counting. Subsequently, after the iterative search converges, an analog varactor may be adjusted for fine tuning the VCO frequency. As shown in FIG. 6B, a predictive search may be performed based on the look-up table. The predictive search yields an initial capacitance value $C_0$. Because the look-up table may not necessarily be accurate or precise, an iterative search, such as a binary search, may be subsequently performed on a binary-weighted capacitor bank for course tuning of the VCO frequency. Subsequently, after the iterative search converges, an analog varactor may be adjusted for fine tuning the VCO frequency. Use of the predictive search before performing the iterative search, as shown in FIG. 6B, reduces the iterative search time as compared to the iterative search time in FIG. 6A.

Figure 7A:
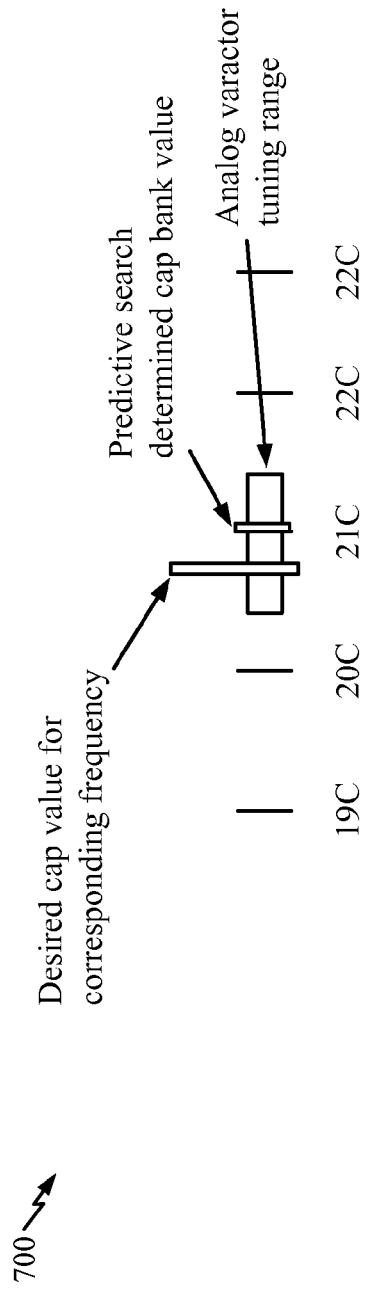
FIG. 7A is a first diagram illustrating an exemplary predictive search.

FIG. 7A is a first diagram 700 illustrating an exemplary predictive search. As discussed supra, the wireless device 110 may adjust a capacitor bank (e.g., the capacitor bank 304) within a capacitor circuit (e.g., the capacitor circuit 310) in a VCO based on a determined relative capacitance change $\Delta C$. If the wireless device 110 determines that the difference between an adjusted frequency and a desired frequency is less than a threshold, the wireless device 110 may adjust a fine tuning capacitor circuit (e.g., the varactor(s) 308) within the capacitor circuit in order to tune from the adjusted frequency to the desired frequency. For example, referring to FIG. 7A, based on a determined relative capacitance change, the wireless device 110 adjusts a capacitance of a binary-weighted capacitor bank to 21C in a capacitor bank in the VCO. The adjustment of the capacitance results in an adjusted frequency that is within a threshold of a desired frequency. The desired frequency corresponds to a capacitance value of around 20.75C, which is within a range of a fine tuning capacitor circuit. Accordingly, the wireless device 110 adjusts the fine tuning capacitor circuit until the desired frequency is obtained. To obtain the desired frequency, the wireless device 110 adjusts the fine tuning capacitor circuit until a total capacitance of the capacitor circuit is about 20.75C.

Figure 7B:
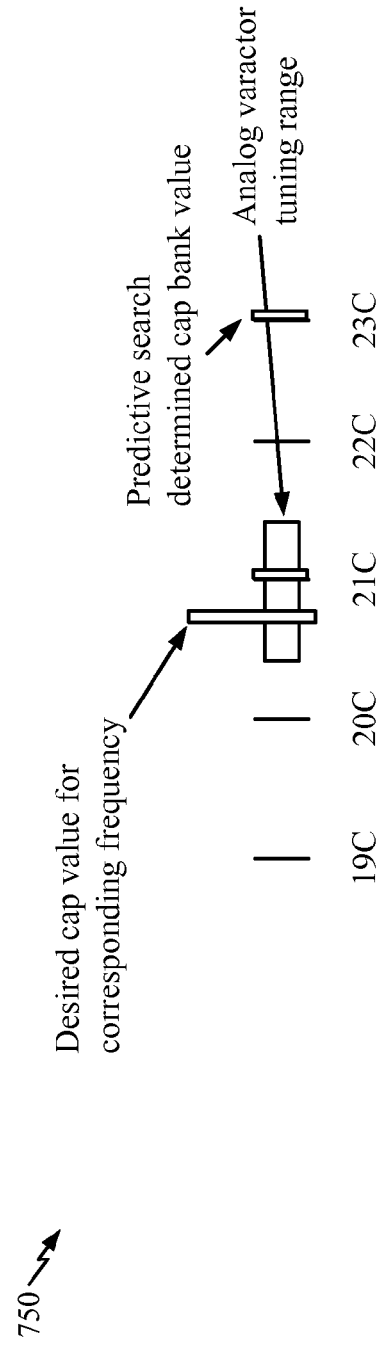
FIG. 7B is a second diagram illustrating an exemplary predictive search.

FIG. 7B is a second diagram 750 illustrating an exemplary predictive search. As discussed supra, the wireless device 110 may adjust a capacitor bank (e.g., the capacitor bank 304) within a capacitor circuit (e.g., the capacitor circuit 310) in a VCO based on a determined relative capacitance change $\Delta C$. After adjusting the capacitor bank in the VCO based on the determined relative capacitance change, if the wireless device 110 determines that the difference between an adjusted frequency and a desired frequency is greater than a threshold, the wireless device 110 may perform an iterative search for course tuning of the VCO frequency. The iterative search is performed with an initial capacitance value $C_0$ provided by the predictive search. When the difference between the adjusted frequency and the desired frequency is less than the threshold during the iterative search, the wireless device 110 may then adjust a fine tuning capacitor circuit (e.g., the varactor(s) 308) within the capacitor circuit for fine tuning from the adjusted frequency to the desired frequency. For example, referring to FIG. 7B, based on a determined relative capacitance change, the wireless device 110 adjusts a capacitance of a binary-weighted capacitor bank to 23C in a capacitor bank in the VCO. The adjustment of the capacitance results in an adjusted frequency that is outside a threshold of a desired frequency. Subsequently, the wireless device 110 performs an iterative search. The iterative search adjusts a capacitance of the capacitor bank to 21C, which results in an adjusted frequency within a threshold of a desired frequency. The desired frequency corresponds to a capacitance value of around 20.75C, which is within a range of a fine tuning capacitor circuit. Accordingly, the wireless device 110 adjusts the fine tuning capacitor circuit until the desired frequency is obtained. To obtain the desired frequency, the wireless device 110 adjusts the fine tuning capacitor circuit until a total capacitance of the capacitor circuit is about 20.75C.

Figure 8:
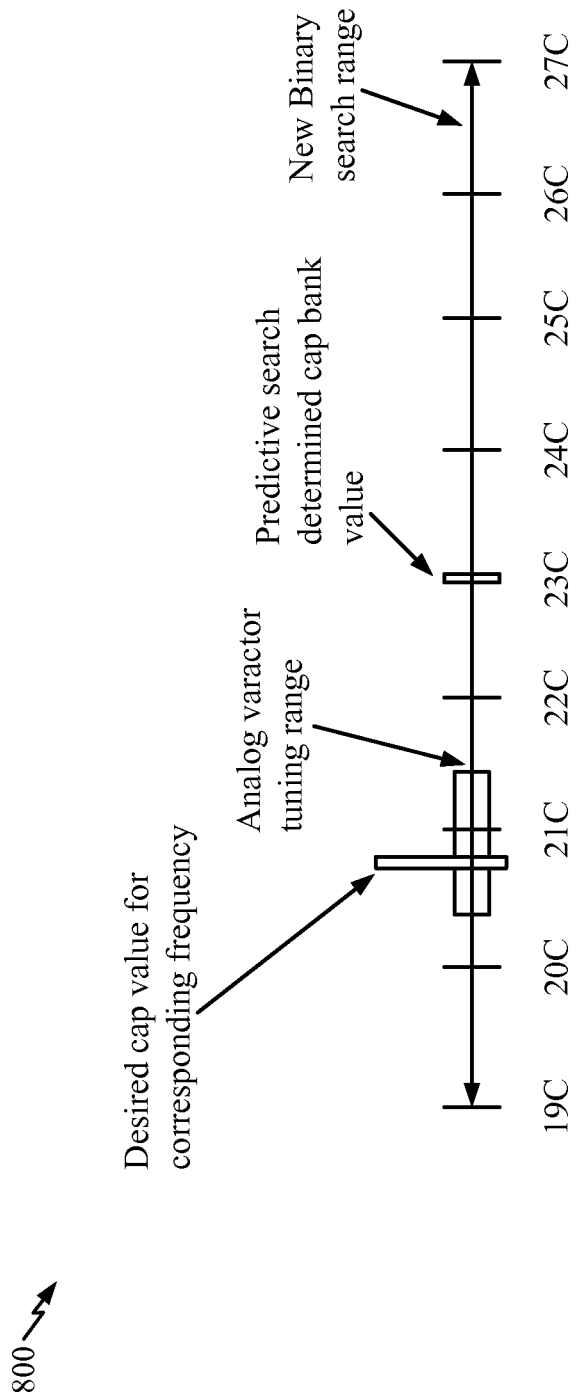
FIG. 8 is a diagram illustrating a search range upon a predictive search.

FIG. 8 is a diagram 800 illustrating a search range upon a predictive search. As discussed supra, the wireless device 110 may adjust a capacitor bank (e.g., the capacitor bank 304) within a capacitor circuit (e.g., the capacitor circuit 310) in a VCO based on a determined relative capacitance change $\Delta C$. After adjusting the capacitor bank in the VCO based on the determined relative capacitance change, the wireless device 110 may determine the difference between the adjusted frequency and the desired frequency. The wireless device 110 may then determine a capacitance error based on the determined difference by utilizing the look-up table. The wireless device 110 may then perform an iterative search with a capacitance search range greater than or equal to n times the determined capacitance error, where n is greater than or equal to one. In one configuration, n is greater than or equal to two. For example, referring to FIG. 8, based on a determined relative capacitance change, the wireless device 110 adjusts a capacitance of a binary-weighted capacitor bank to 23C in a capacitor bank in the VCO. The adjustment of the capacitance results in an adjusted frequency that is outside a threshold of a desired frequency. Subsequently, the wireless device 110 performs an iterative search. The iterative search is performed with an initial capacitance value $C_0=23C$ and a search range of ±4C, which is greater than or equal to a capacitance error of 2.25C (i.e., 23C−20.75C, n in this example is 4/2.25≈1.78). The wireless device 110 may determine the capacitance error from the look-up table, such as the look-up table of FIG. 4B, by determining the adjusted frequency at the capacitance value of 23C, and determining the relative capacitance change $\Delta C$ to obtain the desired frequency from the adjusted frequency.

Figure 9:
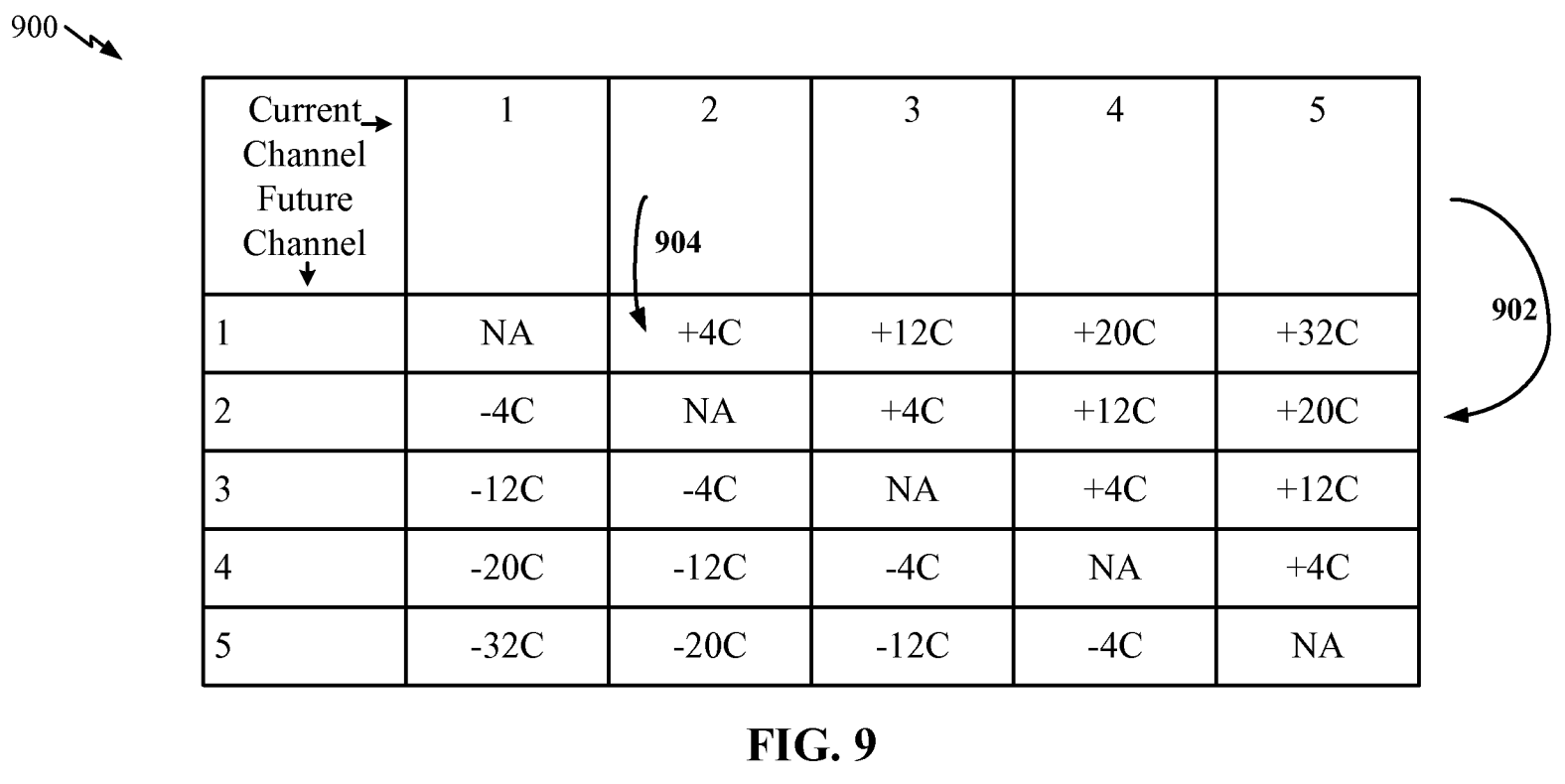

FIG. 9 is a diagram 900 for illustrating a multi-step process of using the relative look-up table. As discussed supra, the wireless device 110 may adjust a capacitor bank (e.g., the capacitor bank 304) within a capacitor circuit (e.g., the capacitor circuit 310) in a VCO based on a determined relative capacitance change $\Delta C$. Assume that after the wireless device 110 adjusts the capacitor bank, the wireless device 110 determines that an adjusted frequency differs from the desired frequency. Subsequently, the wireless device 110 may determine a second relative capacitance change $\Delta C_2$ associated with the adjusted frequency and the desired frequency from the look-up table. The wireless device 110 may then re-adjust the capacitor circuit based on the determined second relative capacitance change $\Delta C_2$ in order to tune from the adjusted frequency to the desired frequency. For example, referring to FIG. 9, the wireless device 110 may determine to adjust the VCO frequency from a frequency corresponding to channel 5 to a frequency corresponding to channel 1. As such, the wireless device 110 may adjust a capacitance of the capacitor bank by 32C. However, after adjusting the capacitor bank, the wireless device 110 determines that the adjusted VCO frequency corresponds to channel 2 (902). As such, the wireless device 110 may determine a second relative capacitance change of 4C associated with changing from a frequency corresponding to channel 2 to a frequency corresponding to channel 1(904). The wireless device 110 may then re-adjust the capacitor bank by 4C in order to tune from the adjusted frequency corresponding to channel 2 to the desired frequency corresponding to channel 1.

Figure 10:
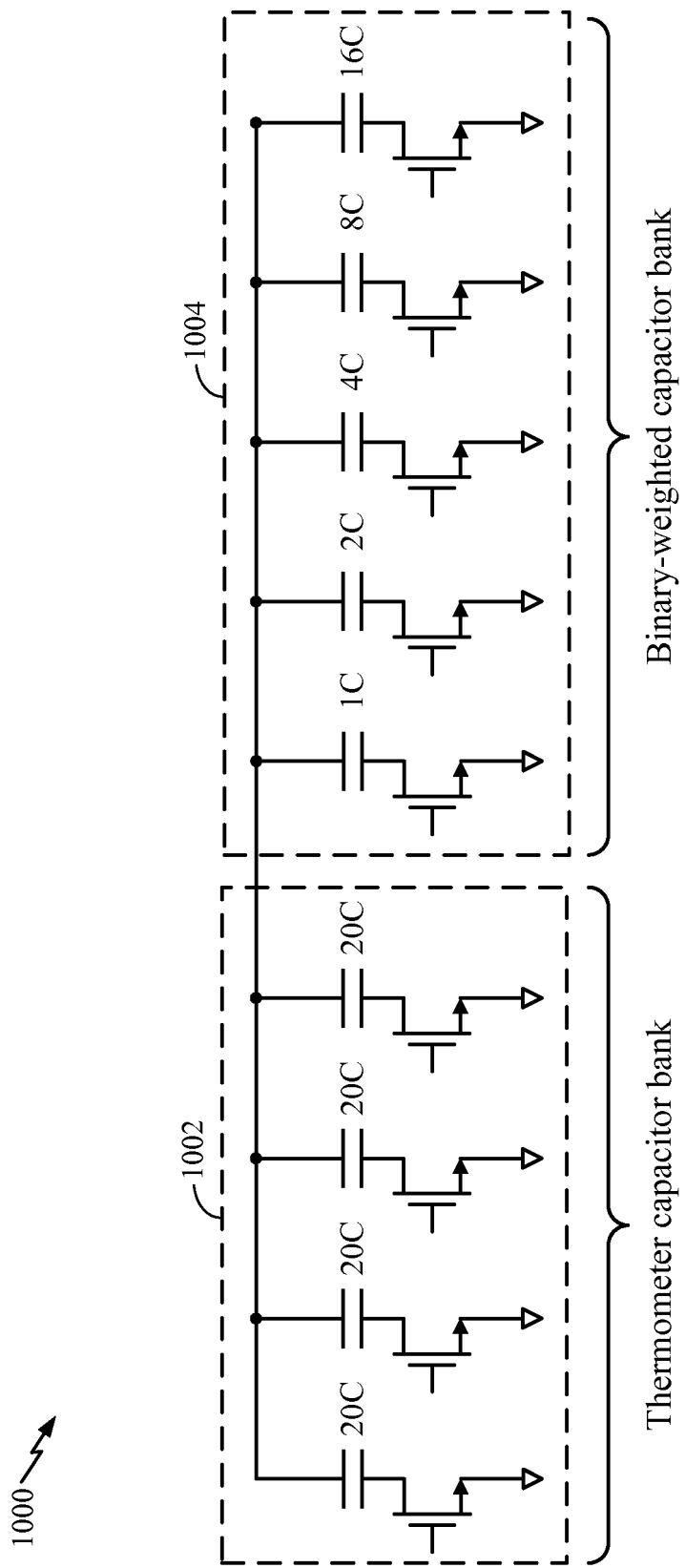
FIG. 10 is a schematic circuit diagram of the exemplary set of capacitor banks.

FIG. 10 is a schematic circuit diagram 1000 of the exemplary set of capacitor banks. The capacitor bank 304 may include a first capacitor bank 1002 and a second capacitor bank 1004. The first capacitor bank 1002 may be referred to as a thermometer capacitor bank. The first capacitor bank 1002 may include a plurality of capacitors that each carries the same unit of capacitance (e.g., 20C in FIG. 10). The second capacitor bank 1004 may be a binary-weighted capacitor bank.

Figure 11A:
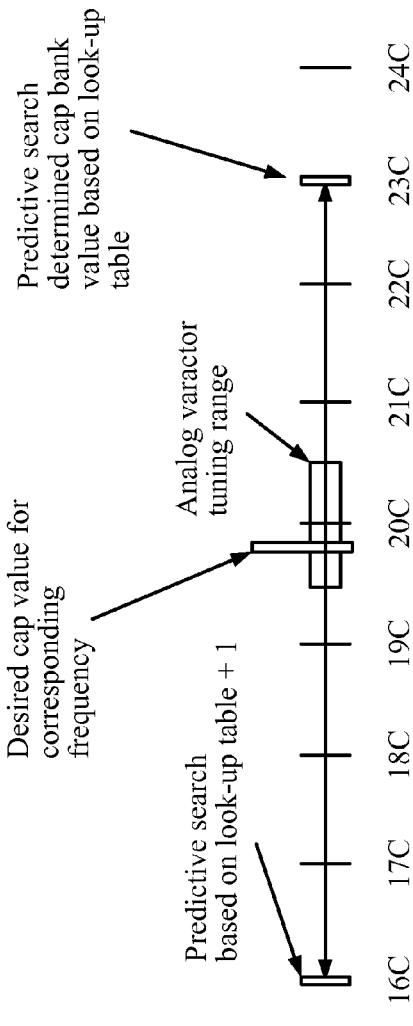
FIG. 11A is a first diagram illustrating an exemplary predictive search when utilizing the set of capacitor banks of FIG. 10.
Figure 11B:
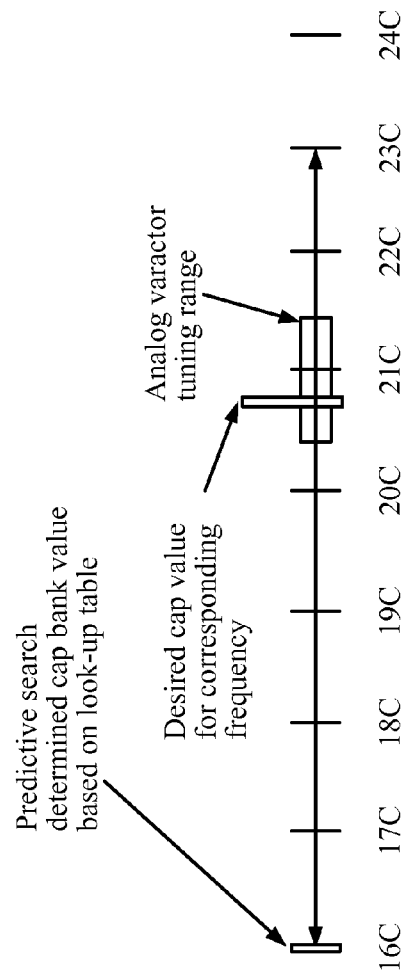
FIG. 11B is a second diagram illustrating an exemplary predictive search when utilizing the set of capacitor banks of FIG. 10.

FIG. 11A is a first diagram 1100 illustrating an exemplary predictive search when utilizing the set of capacitor banks of FIG. 10. FIG. 11B is a second diagram 1150 illustrating an exemplary predictive search when utilizing the set of capacitor banks of FIG. 10. As discussed supra, a wireless device 110 determines a relative capacitance change associated with an initial frequency and a desired frequency from a look-up table, and adjusts a capacitor circuit in the VCO based on the determined relative capacitance change. The wireless device 110 may then determine that the frequency provided by the VCO is an adjusted frequency different than the desired frequency after adjusting the capacitor circuit based on the look-up table and before performing the iterative search. The wireless device 110 may then determine whether the difference between the adjusted frequency and the desired frequency is greater than a threshold. If the difference between the adjusted frequency and the desired frequency is greater than the threshold, the wireless device 110 may determine whether the adjusted frequency is greater than or less than the desired frequency. If the wireless device 110 determines that the adjusted frequency is greater than the desired frequency, the wireless device 110 may determine to refrain from re-adjusting the capacitor circuit based on the look-up table. However, if the wireless device 110 determines that the adjusted frequency is less than the desired frequency, the wireless device 110 may determine a capacitance associated with a second adjusted frequency higher than the adjusted frequency from the look-up table. The second adjusted frequency may be one step higher in the look-up table. The wireless device 110 may then re-adjust the capacitor circuit based on the determined capacitance. The predictive search adjustments to the capacitor circuit may occur only to the first capacitor bank 1002. Subsequent adjustments to the capacitance of the capacitor circuit during an iterative search may occur only to the second capacitor bank 1004. Accordingly, in this exemplary method, the capacitance of the capacitor bank is adjusted by the predictive search to be less than or equal to the capacitance needed to obtain the desired frequency.

For example, referring to FIG. 11A, assume that a wireless device 110 determines a relative capacitance change associated with an initial frequency and a desired frequency from a look-up table, and adjusts a capacitor circuit in the VCO based on the determined relative capacitance change. Further, assume that after the wireless device 110 adjusts the capacitor circuit, the capacitance of the capacitor circuit is 23C. The wireless device 110 may then determine that the frequency provided by the VCO is not at the desired frequency and is not within a threshold corresponding to a tuning range of a set of varactors. The wireless device 110 then determines that the frequency provided by the VCO (which corresponds to a capacitance of 23C) is less than the desired frequency (which corresponds to a capacitance of 19.75C). Accordingly, the wireless device 110 determines a capacitance 16C associated with a frequency in the look-up table greater than the desired frequency in the look-up table, and re-adjusts the capacitor circuit based on the determined capacitance of 16C. The wireless device 110 may then perform an iterative search with an initial capacitance value $C_0$=16C.

For another example, assume that the wireless device 110 desires to tune from an initial frequency corresponding to channel four to a desired frequency corresponding to channel two. Referring to the look-up table in FIG. 4B, the wireless device increases the capacitance of the capacitor circuit in the VCO by 12C. Assume the wireless device 110 determines that the frequency provided by the VCO is less than the desired frequency. Assume also that the frequency provided by the VCO corresponds to 23C and that the desired frequency corresponds to 19.75C. The wireless device 110 may then refer to the look-up table in FIG. 4B, and determine to decrease the capacitance of the capacitor circuit by 8C corresponding to channel 3. The capacitance value of 8C is the additional capacitance to remove when moving from the current channel four and future channel 2 to the current channel four and future channel 3.

For another example, assume that the wireless device 110 desires to tune from an initial frequency corresponding to channel four to a desired frequency corresponding to channel two. Referring to the look-up table in FIG. 4A, the wireless device increases the capacitance of the capacitor circuit in the VCO by 14C (the look-up tables of FIGS. 4A, 4B do not have corresponding values), changing the capacitance of the capacitor circuit in the VCO from 80C to 94C. Assume the wireless device 110 determines that the frequency provided by the VCO is less than the desired frequency. Assume also that the frequency provided by the VCO actually corresponds to 97C and that the desired frequency actually corresponds to 93C. The wireless device 110 may then refer to the look-up table in FIG. 4A, and determine to decrease the capacitance of the capacitor circuit by 6C (i.e., 94C-88C) corresponding to channel 3. The wireless device 110 may then perform an iterative search to further converge to the desired frequency.

For another example, referring to FIG. 11B, assume that a wireless device 110 determines a relative capacitance change associated with an initial frequency and a desired frequency from a look-up table, and adjusts a capacitor circuit in the VCO based on the determined relative capacitance change. Further, assume that after the wireless device 110 adjusts the capacitor circuit, the capacitance of the capacitor circuit is 16C. The wireless device 110 may then determine that the frequency provided by the VCO is not at the desired frequency and is not within a threshold corresponding to a tuning range of a set of varactors. The wireless device 110 then determines that the frequency provided by the VCO (which corresponds to a capacitance of 16C) is greater than the desired frequency (which corresponds to a capacitance of 20.75C). Because the frequency provided by the VCO is greater than the desired frequency, the wireless device 110 determines to refrain from re-adjusting the capacitor circuit based on the look-up table. The wireless device 110 may then perform an iterative search with an initial capacitance value $C_0=16C$.

Figure 12:
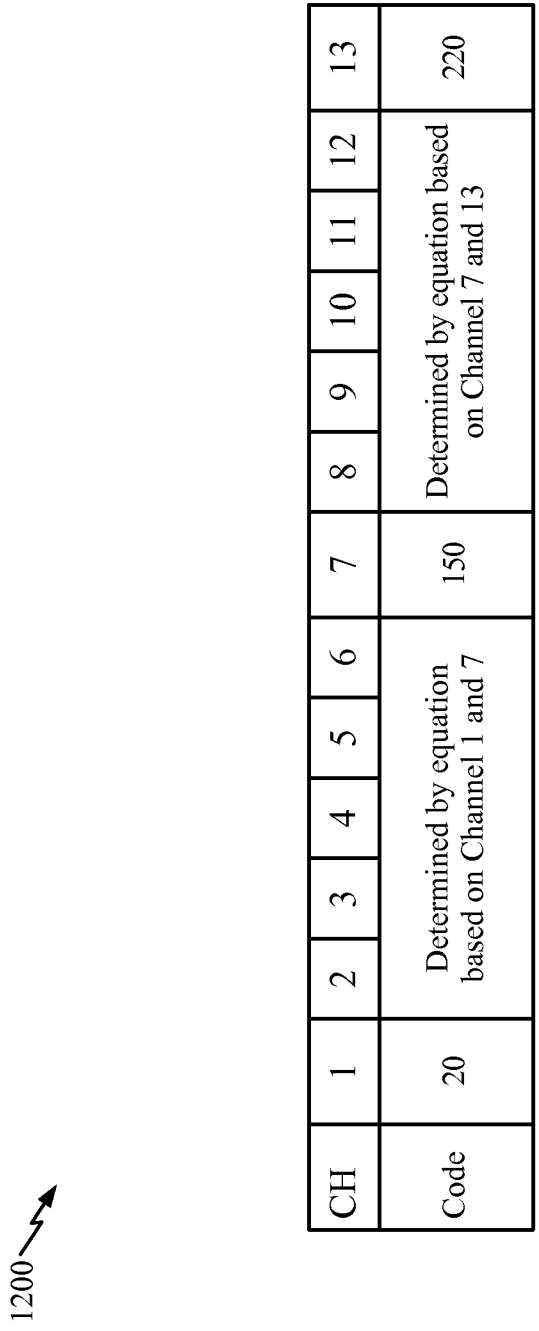
FIG. 12 is a diagram for illustrating an exemplary look-up table.

FIG. 12 is a diagram 1200 for illustrating an exemplary look-up table. The relative capacitance change $\Delta C$ for tuning from one frequency to another frequency may be determined based on a polynomial-based equation (e.g., through interpolation) determined from table values in the look-up table. Further, the relative capacitance change for tuning from one frequency to another frequency may be determined by utilizing a stored polynomial coefficient extracted from the polynomial-based equation. The table values in the look-up table may be determined based on a built-in self test that allows the wireless device 110 to determine a particular capacitance for a particular channel. For example, the capacitance values of 20C, 150C, and 220C may be determined for channels 1, 7, and 13, respectively, based on a built-in self test. When the wireless device 110 desires to tune to a frequency not populated in the look-up table, the wireless device may determine a relative capacitance change based on a polynomial-based equation and/or stored polynomial coefficients extracted from a polynomial-based equation. For example, referring to FIG. 12, the relative capacitance change for channels 2-6 may be determined by an equation and/or coefficients of an equation based on the capacitance values from channels 1 and 7, and the relative capacitance change for channels 8-12 may be determined by an equation and/or coefficients of an equation based on the capacitance values from channels 7 and 13.

Figure 13:
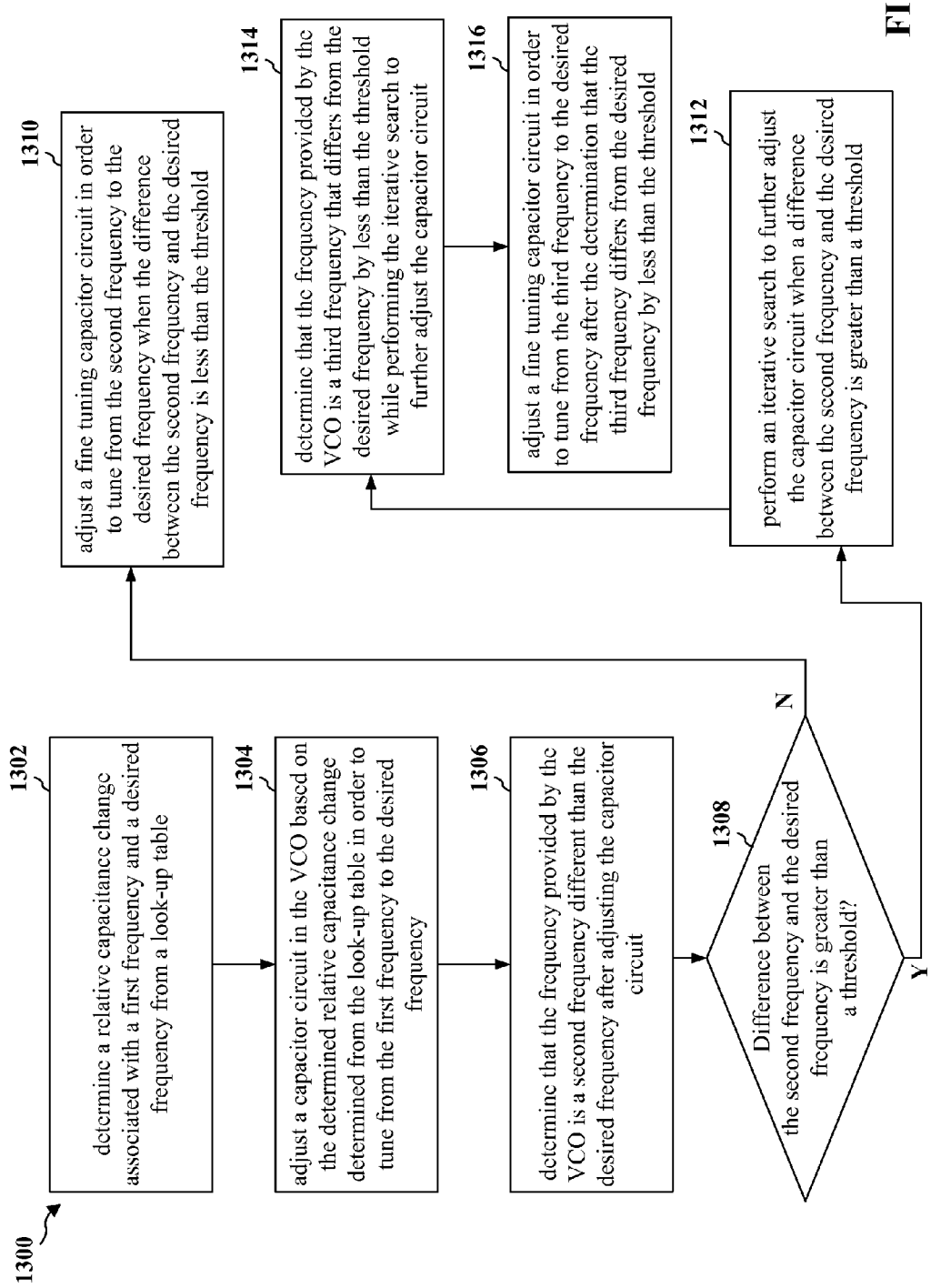
FIG. 13 is a flow chart of a first method of tuning a frequency provided by a VCO.

FIG. 13 is a flow chart 1300 of a first method of tuning a frequency provided by a VCO. The method may be performed by an apparatus, such as the VCO and/or a processor/controller (e.g., the data processor/controller 210) configured to control the VCO. In step 1302, the apparatus determines a relative capacitance change associated with a first frequency and a desired frequency from a look-up table. In step 1304, the apparatus adjusts a capacitor circuit in the VCO based on the determined relative capacitance change determined from the look-up table in order to tune from the first frequency to the desired frequency. In step 1306, the apparatus determines that the frequency provided by the VCO is a second frequency different than the desired frequency after adjusting the capacitor circuit. In step 1308, the apparatus determines whether the difference between the second frequency and the desired frequency is greater than a threshold. If the difference between the second frequency and the desired frequency is less than the threshold, in step 1310, the apparatus adjusts a fine tuning capacitor circuit in order to tune from the second frequency to the desired frequency. If the difference between the second frequency and the desired frequency is greater than the threshold, in step 1312, the apparatus performs an iterative search to further adjust the capacitor circuit. In step 1314, the apparatus determines that the frequency provided by the VCO is a third frequency that differs from the desired frequency by less than the threshold while performing the iterative search to further adjust the capacitor circuit. In step 1316, the apparatus adjusts a fine tuning capacitor circuit in order to tune from the third frequency to the desired frequency after the determination that the third frequency differs from the desired frequency by less than the threshold. The threshold may correspond to a tuning range of the fine tuning capacitor circuit.

For example, referring to FIGS. 7A, 7B, an apparatus determines a relative capacitance change associated with a first frequency and a desired frequency (corresponding to a capacitance of 20.75C) from a look-up table (see FIG. 4B). In a predictive search, the apparatus adjusts a capacitor circuit (see FIGS. 3, 10) in the VCO (see FIGS. 2, 3) based on the determined relative capacitance change determined from the look-up table in order to tune from the first frequency to the desired frequency. The adjusted capacitance may be 21C as shown in FIG. 7A or 23C as shown in FIG. 7B. The apparatus determines that the frequency provided by the VCO is a second frequency different than the desired frequency after adjusting the capacitor circuit. The second frequency may correspond to a capacitance of 21C, as shown in FIG. 7A, or to a capacitance of 23C, as shown in FIG. 7B. The apparatus determines whether the difference between the second frequency and the desired frequency is greater than a threshold. The threshold may correspond to a tuning range of a set of varactors in the capacitor circuit. Referring to FIG. 7A, if the difference between the second frequency and the desired frequency is less than the threshold, the apparatus adjusts the set of varactors in order to tune from the second frequency to the desired frequency. Referring to FIG. 7B, if the difference between the second frequency and the desired frequency is greater than the threshold, the apparatus performs an iterative search to further adjust the capacitor circuit. Subsequently, the apparatus determines that the frequency provided by the VCO is a third frequency (corresponding to a capacitance of 21C) that differs from the desired frequency by less than the threshold while performing the iterative search to further adjust the capacitor circuit. The apparatus adjusts the set of varactors in order to tune from the third frequency to the desired frequency after the determination that the third frequency differs from the desired frequency by less than the threshold.

Figure 14:
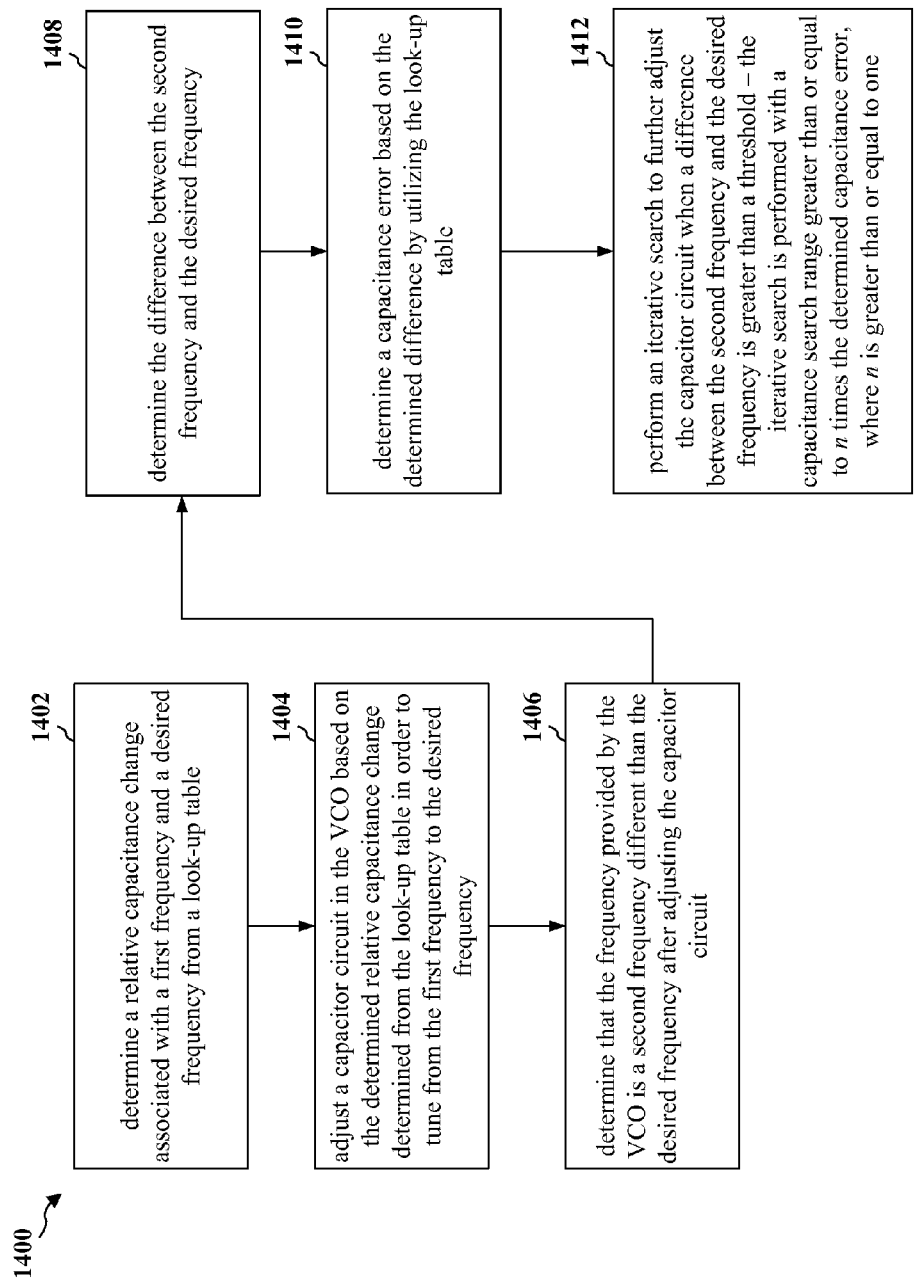
FIG. 14 is a flow chart of a second method of tuning a frequency provided by a VCO.

FIG. 14 is a flow chart of a second method of tuning a frequency provided by a VCO. The method may be performed by an apparatus, such as the VCO and/or a processor/controller (e.g., the data processor/controller 210) configured to control the VCO. In step 1402, the apparatus determines a relative capacitance change associated with a first frequency and a desired frequency from a look-up table. In step 1404, the apparatus adjusts a capacitor circuit in the VCO based on the determined relative capacitance change determined from the look-up table in order to tune from the first frequency to the desired frequency. In step 1406, the apparatus determines that the frequency provided by the VCO is a second frequency different than the desired frequency after adjusting the capacitor circuit. In step 1408, the apparatus determines the difference between the second frequency and the desired frequency. In step 1410, the apparatus determines a capacitance error based on the determined difference by utilizing the look-up table. In step 1412, the apparatus performs an iterative search to further adjust the capacitor circuit when a difference between the second frequency and the desired frequency is greater than a threshold. The iterative search is performed with a capacitance search range greater than or equal to n times the determined capacitance error, where n is greater than or equal to one.

For example, referring to FIG. 8, an apparatus determines a relative capacitance change associated with a first frequency and a desired frequency (corresponding to a capacitance of 20.75C) from a look-up table (see FIG. 4B). The apparatus adjusts a capacitor circuit (see FIGS. 3, 10) in the VCO (see FIGS. 2, 3) based on the determined relative capacitance change determined from the look-up table in order to tune from the first frequency to the desired frequency. The adjusted capacitance may be 23C as shown in FIG. 8. The apparatus determines that the frequency provided by the VCO is a second frequency (corresponding to a capacitance of 23C)

different than the desired frequency after adjusting the capacitor circuit. The apparatus determines the difference between the second frequency and the desired frequency. The apparatus determines a capacitance error based on the determined difference by utilizing the look-up table. The apparatus may determine the capacitance error to be 23C−20.75C=2.25C. The apparatus performs an iterative search to further adjust the capacitor circuit when a difference between the second frequency and the desired frequency is greater than a threshold corresponding to a tuning range of a set of varactors. The iterative search is performed with a capacitance search range of ±4, which is greater than or equal to n times the determined capacitance error, where n is greater than or equal to one.

Figure 15:
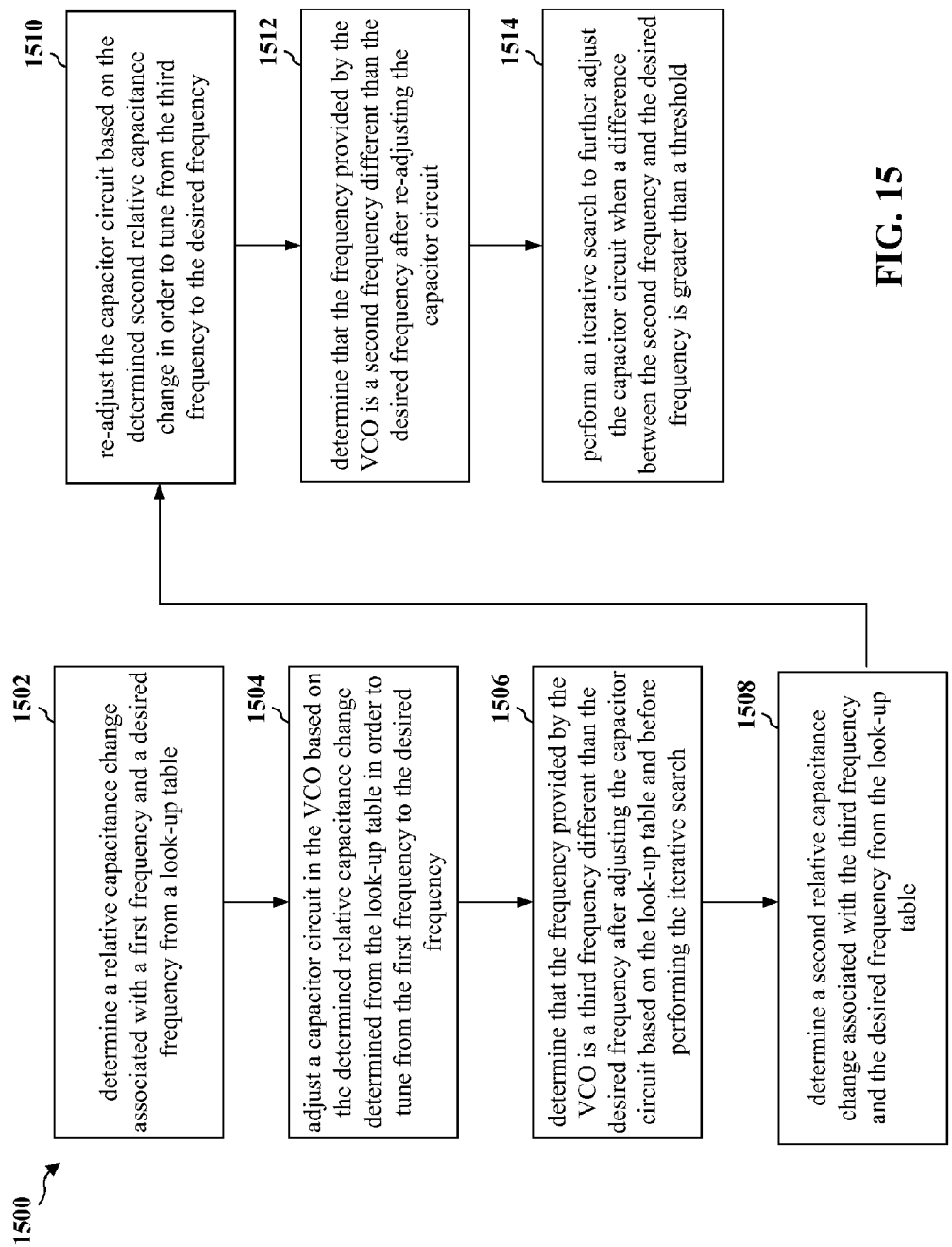
FIG. 15 is a flow chart of a third method of tuning a frequency provided by a VCO.

FIG. 15 is a flow chart of a third method of tuning a frequency provided by a VCO. The method may be performed by an apparatus, such as the VCO and/or a processor/controller (e.g., the data processor/controller 210) configured to control the VCO. In step 1502, the apparatus determines a relative capacitance change associated with a first frequency and a desired frequency from a look-up table. In step 1504, the apparatus adjusts a capacitor circuit in the VCO based on the determined relative capacitance change determined from the look-up table in order to tune from the first frequency to the desired frequency. In step 1506, the apparatus determines that the frequency provided by the VCO is a third frequency different than the desired frequency after adjusting the capacitor circuit based on the look-up table and before performing the iterative search. In step 1508, the apparatus determines a second relative capacitance change associated with the third frequency and the desired frequency from the look-up table. In step 1510, the apparatus re-adjusts the capacitor circuit based on the determined second relative capacitance change in order to tune from the third frequency to the desired frequency. In step 1512, the apparatus determines that the frequency provided by the VCO is a second frequency different than the desired frequency after re-adjusting the capacitor circuit. In step 1514, the apparatus performs an iterative search to further adjust the capacitor circuit when a difference between the second frequency and the desired frequency is greater than a threshold. The threshold may correspond to a tuning range of a fine tuning capacitor circuit in the capacitor circuit.

For example, referring to FIG. 9, an apparatus determines a relative capacitance change associated with a first frequency (corresponding to channel 5) and a desired frequency (corresponding to channel 1) from a look-up table (see FIG. 4B). The apparatus adjusts a capacitor circuit (see FIGS. 3, 10) in the VCO (see FIGS. 2, 3) based on the determined relative capacitance change determined from the look-up table in order to tune from the first frequency to the desired frequency. The apparatus determines that the frequency provided by the VCO is a third frequency (corresponding to channel 2) different than the desired frequency after adjusting the capacitor circuit based on the look-up table and before performing the iterative search. The apparatus determines a second relative capacitance change associated with the third frequency and the desired frequency from the look-up table. The apparatus re-adjusts the capacitor circuit based on the determined second relative capacitance change in order to tune from the third frequency to the desired frequency. The apparatus determines that the frequency provided by the VCO is a second frequency different than the desired frequency after adjusting the capacitor circuit. The second frequency does not exactly correspond to the channel 1. The apparatus performs an iterative search to further adjust the capacitor circuit when a difference between the second frequency and the desired frequency is greater than a threshold corresponding to a tuning range of a set of varactors in the capacitor circuit.

Figure 16:
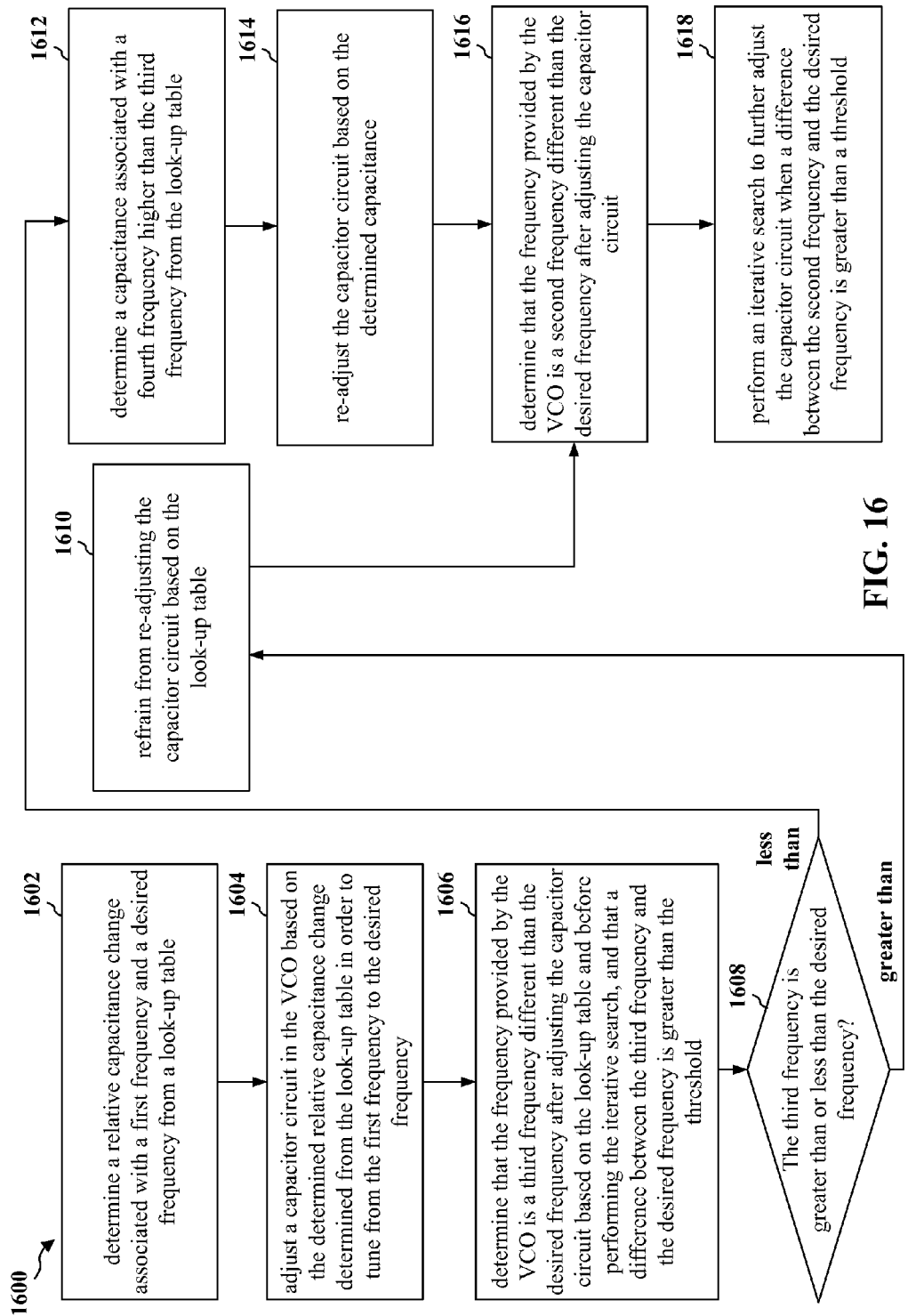
FIG. 16 is a flow chart of a fourth method of tuning a frequency provided by a VCO.

FIG. 16 is a flow chart of a fourth method of tuning a frequency provided by a VCO. The method may be performed by an apparatus, such as the VCO and/or a processor/controller (e.g., the data processor/controller 210) configured to control the VCO. In step 1602, the apparatus determines a relative capacitance change associated with a first frequency and a desired frequency from a look-up table. In step 1604, the apparatus adjusts a capacitor circuit in the VCO based on the determined relative capacitance change determined from the look-up table in order to tune from the first frequency to the desired frequency. In step 1606, the apparatus determines that the frequency provided by the VCO is a third frequency different than the desired frequency after adjusting the capacitor circuit based on the look-up table and before performing the iterative search, and that a difference between the third frequency and the desired frequency is greater than a threshold. The threshold may correspond to a tuning range of a fine tuning capacitor circuit in the capacitor circuit. In step 1608, the apparatus determines whether the third frequency is greater than or less than the desired frequency. When the third frequency is less than the desired frequency, in step 1612, the apparatus determines a capacitance associated with a fourth frequency higher than the third frequency from the look-up table. In step 1614, the apparatus re-adjusts the capacitor circuit based on the determined capacitance. The fourth frequency may be one frequency step higher in the look-up table. The capacitor circuit may include a first capacitor circuit and a second capacitor circuit, the apparatus may adjust and re-adjust the first capacitor circuit during the predictive search, and the apparatus may adjust the second capacitor circuit during the iterative search. However, in step 1608, when the third frequency is greater than the desired frequency, in step 1610, the apparatus refrains from re-adjusting the capacitor circuit based on the look-up table. The capacitor circuit may include a first capacitor circuit and a second capacitor circuit, the apparatus may adjust the first capacitor circuit during the predictive search, and the apparatus may adjust the second capacitor circuit during the iterative search. Following steps 1610 and 1614, in step 1616, the apparatus determines that the frequency provided by the VCO is a second frequency different than the desired frequency after adjusting the capacitor circuit. In step 1618, the apparatus performs an iterative search to further adjust the capacitor circuit when a difference between the second frequency and the desired frequency is greater than the threshold.

For example, referring to FIGS. 11A, 11B, an apparatus determines a relative capacitance change associated with a first frequency and a desired frequency from a look-up table (see FIG. 4B). In step 1604, the apparatus adjusts a capacitor circuit (see FIGS. 3, 10) in the VCO (see FIGS. 2, 3) based on the determined relative capacitance change determined from the look-up table in order to tune from the first frequency to the desired frequency. The apparatus determines that the frequency provided by the VCO is a third frequency different than the desired frequency after adjusting the capacitor circuit based on the look-up table and before performing the iterative search, and that a difference between the third frequency and the desired frequency is greater than a threshold. The third frequency may correspond to a capacitance of 23C as shown in FIG. 11A or to a capacitance of 16C as shown in FIG. 11B. The apparatus determines whether the third frequency is greater than or less than the desired frequency. Referring to FIG. 11A, when the third frequency (corresponding to a capacitance of 23C) is less than the desired frequency (corresponding to a capacitance of 19.75C), the apparatus determines a capacitance associated with a fourth frequency (corresponding to a capacitance of 16C) higher than the third frequency from the look-up table. The apparatus re-adjusts the capacitor circuit based on the determined capacitance. The fourth frequency may be one frequency step higher in the look-up table. Referring to FIG. 10, the capacitor circuit may include a first capacitor circuit 1002 and a second capacitor circuit 1004, the apparatus may adjust and re-adjust the first capacitor circuit 1002 during the predictive search, and the apparatus may adjust the second capacitor circuit 1004 during the iterative search. Referring to FIG. 11B, when the third frequency (corresponding to a capacitance of 16C) is greater than the desired frequency (corresponding to a capacitance of 20.75C), the apparatus refrains from re-adjusting the capacitor circuit based on the look-up table. Referring to FIG. 10, the capacitor circuit may include a first capacitor circuit 1002 and a second capacitor circuit 1004, the apparatus may adjust the first capacitor circuit 1002 during the predictive search, and the apparatus may adjust the second capacitor circuit 1004 during the iterative search. Subsequently, the apparatus determines that the frequency provided by the VCO is a second frequency (corresponding to a capacitance of 16C for both FIGS. 11A, 11B) different than the desired frequency after adjusting the capacitor circuit. The apparatus performs an iterative search to further adjust the capacitor circuit when a difference between the second frequency and the desired frequency is greater than a threshold corresponding to a tuning range of a set of varactors in the capacitor circuit.

Figure 17:
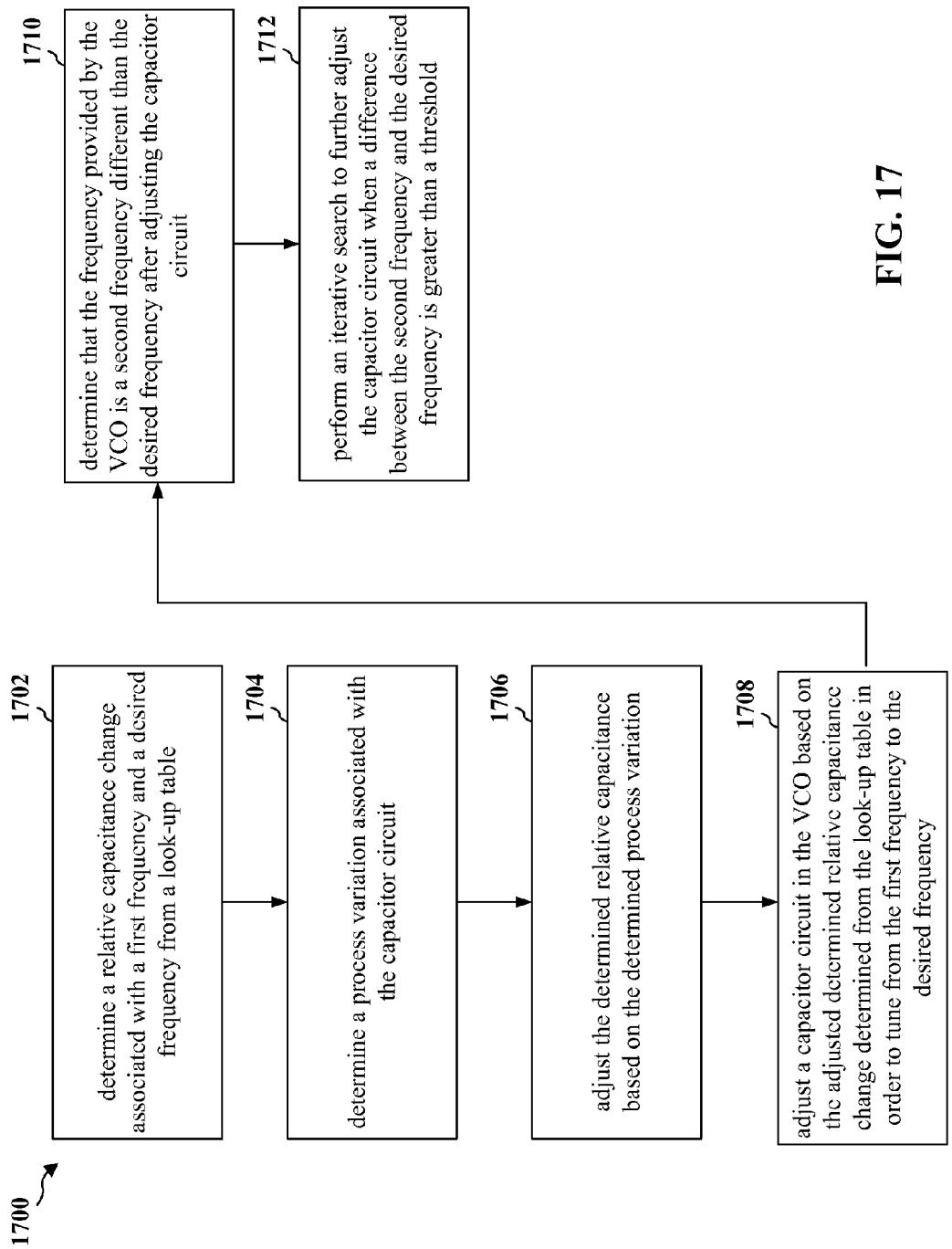
FIG. 17 is a flow chart of a fifth method of tuning a frequency provided by a VCO.

FIG. 17 is a flow chart of a fifth method of tuning a frequency provided by a VCO. The method may be performed by an apparatus, such as the VCO and/or a processor/controller (e.g., the data processor/controller 210) configured to control the VCO. In step 1702, the apparatus determines a relative capacitance change associated with a first frequency and a desired frequency from a look-up table. In step 1704, the apparatus determines a process variation associated with the capacitor circuit. In step 1706, the apparatus adjusts the determined relative capacitance based on the determined process variation. For example, as shown in FIG. 5, the apparatus may adjust the determined relative capacitance to account for a process variation in a capacitance of the capacitors in the capacitor circuit. In step 1708, the apparatus adjusts a capacitor circuit in the VCO based on the adjusted determined relative capacitance change determined from the look-up table in order to tune from the first frequency to the desired frequency. In step 1710, the apparatus determines that the frequency provided by the VCO is a second frequency different than the desired frequency after adjusting the capacitor circuit. In step 1712, the apparatus performs an iterative search to further adjust the capacitor circuit when a difference between the second frequency and the desired frequency is greater than a threshold. The threshold may correspond to a tuning range of a fine tuning capacitor circuit in the capacitor circuit.

As discussed supra in relation to FIG. 12, the relative capacitance change for tuning from the first frequency to the desired frequency may be determined based on a polynomial-based equation determined from table values in the look-up table. Furthermore, the relative capacitance change for tuning from the first frequency to the desired frequency may be determined by utilizing a stored polynomial coefficient extracted from the polynomial-based equation.

Figure 18:
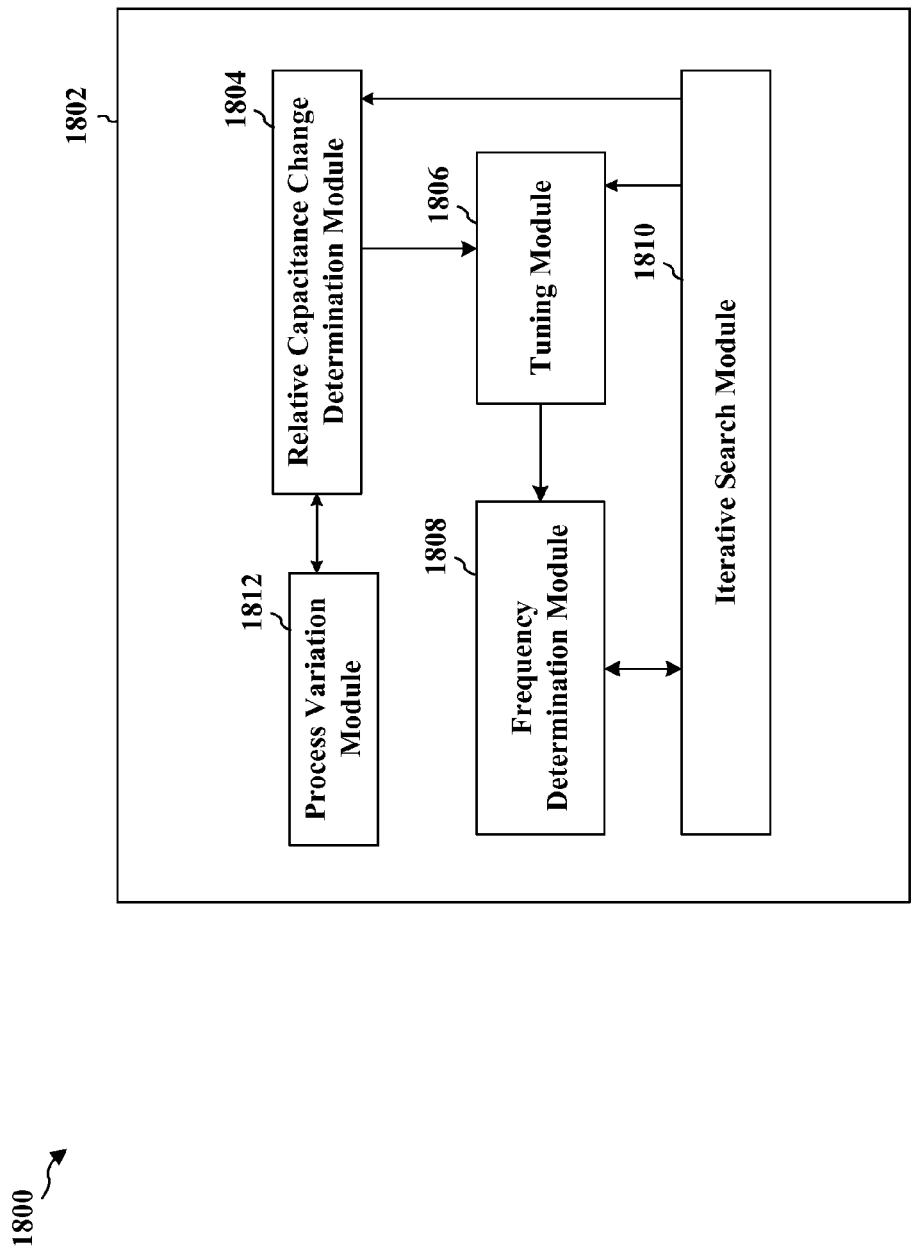
FIG. 18 is a conceptual data flow diagram illustrating the data flow between different modules/means/components in an exemplary apparatus.

FIG. 18 is a conceptual data flow diagram 1800 illustrating the data flow between different modules/means/components in an exemplary apparatus 1802. The apparatus 1802 may be a UE and/or an eNB. Specifically, the apparatus may include the VCO 274, 284, or 322 and/or the data processor/controller 210. The apparatus tunes a frequency provided by a VCO. The apparatus includes a relative capacitance change determination module 1804 that is configured to determine a relative capacitance change associated with a first frequency and a desired frequency from a look-up table. The apparatus further includes a tuning module 1806 that is configured to adjust a capacitor circuit in the VCO based on the determined relative capacitance change determined from the look-up table in order to tune from the first frequency to the desired frequency. The apparatus further includes a frequency determination module 1808 that is configured to determine a frequency provided by the VCO. For example, the frequency determination module 1808 may determine that the frequency provided by the VCO is a second frequency different than the desired frequency after adjusting the capacitor circuit. The apparatus further includes an iterative search module 1810 that is configured to perform an iterative search to further adjust the capacitor circuit when a difference between the second frequency and the desired frequency is greater than a threshold.

The tuning module 1806 may be configured to adjust a fine tuning capacitor circuit in order to tune from the second frequency to the desired frequency when the difference between the second frequency and the desired frequency is less than the threshold. The frequency determination module 1808 may be configured to determine that the frequency provided by the VCO is a third frequency that differs from the desired frequency by less than the threshold while performing the iterative search to further adjust the capacitor circuit. The tuning module 1806 may be configured to adjust a fine tuning capacitor circuit in order to tune from the third frequency to the desired frequency after the determination that the third frequency differs from the desired frequency by less than the threshold. The frequency determination module 1808 may be configured to determine the difference between the second frequency and the desired frequency, and determine a capacitance error based on the determined difference by utilizing the look-up table. The iterative search module 1810 is configured to perform the iterative search with a capacitance search range greater than or equal to n times the determined capacitance error, where n is greater than or equal to one.

The frequency determination module 1808 may be configured to determine that the frequency provided by the VCO is a third frequency different than the desired frequency after adjusting the capacitor circuit based on the look-up table and before performing the iterative search. The relative capacitance change determination module may be configured to determine a second relative capacitance change associated with the third frequency and the desired frequency from the look-up table. The tuning module 1806 may be configured to re-adjust the capacitor circuit based on the determined second relative capacitance change in order to tune from the third frequency to the desired frequency.

The frequency determination module 1808 may be configured to determine that the frequency provided by the VCO is a third frequency different than the desired frequency after adjusting the capacitor circuit based on the look-up table and before performing the iterative search, and that a difference between the third frequency and the desired frequency is greater than the threshold. The frequency determination module 1808 may be further configured to determine whether the third frequency is greater than or less than the desired frequency.

The relative capacitance determination module 1804 may be configured to determine a capacitance associated with a fourth frequency higher than the third frequency from the look-up table when the third frequency is less than the desired frequency. The tuning module 1806 may be configured to re-adjust the capacitor circuit based on the determined capacitance. The fourth frequency may be one frequency step higher in the look-up table. The capacitor circuit may include a first capacitor circuit and a second capacitor circuit, the adjusting and the re-adjusting by the tuning module 1806 may be performed on the first capacitor circuit, and the iterative search module 1810 may adjust the second capacitor circuit. The tuning module 1806 may be configured to refrain from re-adjusting the capacitor circuit based on the look-up table when the third frequency is greater than the desired frequency. The capacitor circuit may include a first capacitor circuit and a second capacitor circuit, the adjusting by the tuning module 1806 may be performed on the first capacitor circuit, and the iterative search module 1810 may adjust the second capacitor circuit.

The apparatus may further include a process variation module 1812. The process variation module 1812 may be configured to determine a process variation associated with the capacitor circuit. The tuning module 1806 may be configured to adjust the determined relative capacitance based on the determined process variation. The tuning module 1806 may adjust the capacitor circuit based on the adjusted determined relative capacitance. The relative capacitance change for tuning from the first frequency to the desired frequency may be determined based on a polynomial-based equation determined from table values in the look-up table. The relative capacitance change for tuning from the first frequency to the desired frequency may be determined by utilizing a stored polynomial coefficient extracted from the polynomial-based equation.

The apparatus may include additional modules that perform each of the steps of the algorithm in the aforementioned flow charts of FIGS. 13-17. As such, each step in the aforementioned flow charts of FIGS. 13-17 may be performed by a module and the apparatus may include one or more of those modules. The modules may be one or more hardware components specifically configured to carry out the stated processes/algorithm, implemented by a processor configured to perform the stated processes/algorithm, stored within a computer-readable medium for implementation by a processor, or some combination thereof.

Figure 19:
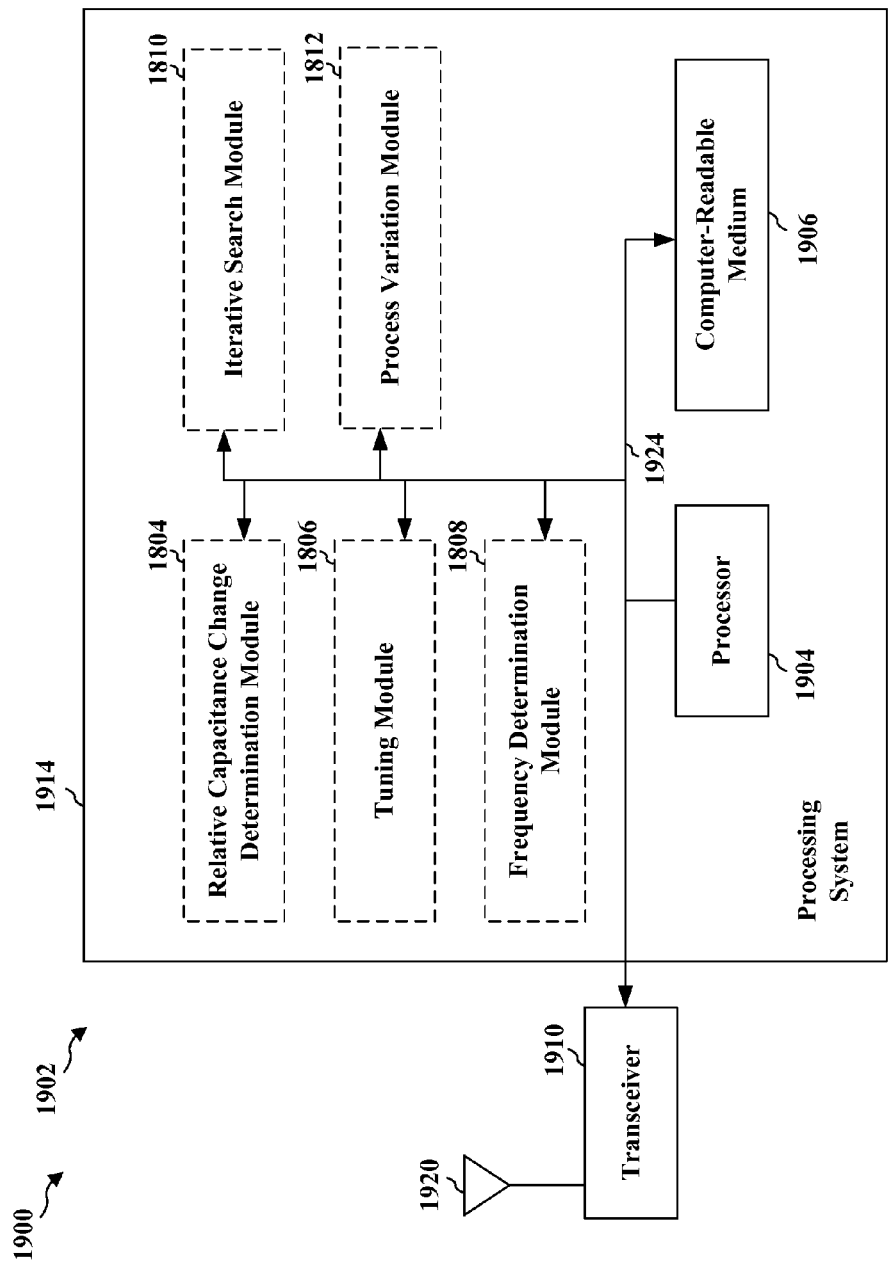
FIG. 19 is a diagram illustrating an example of a hardware implementation for an apparatus employing a processing system.

FIG. 19 is a diagram 1900 illustrating an example of a hardware implementation for an apparatus 1902 employing a processing system 1914. The processing system 1914 may be implemented with a bus architecture, represented generally by the bus 1924. The bus 1924 may include any number of interconnecting buses and bridges depending on the specific application of the processing system 1914 and the overall design constraints. The bus 1924 links together various circuits including one or more processors and/or hardware modules, represented by the processor 1904, the modules 1804, 1806, 1808, 1810, 1812, and the computer-readable medium 1906. The bus 1924 may also link various other circuits such as timing sources, peripherals, voltage regulators, and power management circuits, which are well known in the art, and therefore, will not be described any further.

The processing system 1914 may be coupled to a transceiver 1910. The transceiver 1910 is coupled to one or more antennas 1920. The transceiver 1910 provides a means for communicating with various other apparatus over a transmission medium. The transceiver 1910 receives a signal from the one or more antennas 1920, extracts information from the received signal, and provides the extracted information to the processing system 1914. In addition, the transceiver 1910 receives information from the processing system 1914, and based on the received information, generates a signal to be applied to the one or more antennas 1920. The processing system 1914 includes a processor 1904 coupled to a computer-readable medium 1906. The processor 1904 is responsible for general processing, including the execution of software stored on the computer-readable medium 1906. The software, when executed by the processor 1904, causes the processing system 1914 to perform the various functions described supra for any particular apparatus. The computer-readable medium 1906 may also be used for storing data that is manipulated by the processor 1904 when executing software. The processing system further includes at least one of the modules 1804, 1806, 1808, 1810, 1812. The modules may be software modules running in the processor 1904, resident/stored in the computer readable medium 1906, one or more hardware modules coupled to the processor 1904, or some combination thereof.

In one configuration, the apparatus 1902 includes means for determining a relative capacitance change associated with a first frequency and a desired frequency from a look-up table, means for adjusting a capacitor circuit in the VCO based on the determined relative capacitance change determined from the look-up table in order to tune from the first frequency to the desired frequency, means for determining that the frequency provided by the VCO is a second frequency different than the desired frequency after adjusting the capacitor circuit, and means for performing an iterative search to further adjust the capacitor circuit when a difference between the second frequency and the desired frequency is greater than a threshold. The apparatus may further include means for adjusting a fine tuning capacitor circuit in order to tune from the second frequency to the desired frequency when the difference between the second frequency and the desired frequency is less than the threshold. The apparatus may further include means for determining that the frequency provided by the VCO is a third frequency that differs from the desired frequency by less than the threshold while performing the iterative search to further adjust the capacitor circuit. The apparatus may further include means for adjusting a fine tuning capacitor circuit in order to tune from the third frequency to the desired frequency after the determination that the third frequency differs from the desired frequency by less than the threshold. The apparatus may further include means for determining the difference between the second frequency and the desired frequency, and means for determining a capacitance error based on the determined difference by utilizing the look-up table. In such a configuration, the iterative search is performed with a capacitance search range greater than or equal to n times the determined capacitance error, where n is greater than or equal to one. The apparatus may further include means for determining that the frequency provided by the VCO is a third frequency different than the desired frequency after adjusting the capacitor circuit based on the look-up table and before performing the iterative search, means for determining a second relative capacitance change associated with the third frequency and the desired frequency from the look-up table, and means for re-adjusting the capacitor circuit based on the determined second relative capacitance change in order to tune from the third frequency to the desired frequency. The apparatus may further include means for determining that the frequency provided by the VCO is a third frequency different than the desired frequency after adjusting the capacitor circuit based on the look-up table and before performing the iterative search, and that a difference between the third frequency and the desired frequency is greater than the threshold, and means for determining whether the third frequency is greater than or less than the desired frequency. The apparatus may further include means for determining a capacitance associated with a fourth frequency higher than the third frequency from the look-up table when the third frequency is less than the desired frequency, and means for re-adjusting the capacitor circuit based on the determined capacitance. The apparatus may further include means for refraining from re-adjusting the capacitor circuit based on the look-up table when the third frequency is greater than the desired frequency. The apparatus may further include means for determining a process variation associated with the capacitor circuit, and means for adjusting the determined relative capacitance based on the determined process variation. In such a configuration, the capacitor circuit is adjusted based on the adjusted determined relative capacitance. The aforementioned means may be one or more of the aforementioned modules of the apparatus 1802, the processing system 1914 of the apparatus 1902, the VCO 274, 284, or 322, the data processor/controller 210, and/or the processing system 320 configured to perform the functions recited by the aforementioned means.

It is understood that the specific order or hierarchy of steps in the processes disclosed is an illustration of exemplary approaches. Based upon design preferences, it is understood that the specific order or hierarchy of steps in the processes may be rearranged. Further, some steps may be combined or omitted. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

What is claimed is:

1. A method of operating a voltage controlled oscillator (VCO), the method comprising:
   accessing an entry of a look-up table, the entry indicating a relative capacitance change associated with a first frequency and a target frequency;
   adjusting a capacitor circuit in the VCO based on the relative capacitance change;
   after adjusting the capacitor circuit, determining that a signal provided by the VCO has a second frequency that is different than the target frequency; and
   performing a search to further adjust the capacitor circuit when a difference between the second frequency and the target frequency is greater than a threshold.

2. The method of claim 1, further comprising adjusting a fine tuning capacitor circuit in order to tune from the second frequency to the target frequency When the difference between the second frequency and the target frequency is less than the threshold.

3. The method of claim 1, further comprising:
   determining that the signal provided by the VCO has a third frequency that differs from the target frequency by less than the threshold while performing the search to further adjust the capacitor circuit; and
   adjusting a fine tuning capacitor circuit in order to tune from the third frequency to the target frequency after the determination that the third frequency differs from the target frequency by less than the threshold.

4. The method of claim 1, further comprising:
   determining the difference between the second frequency and the target frequency; and
   determining a capacitance error based on the difference by utilizing the look-up table,
   wherein the search is performed with a capacitance search range greater than or equal to n times the capacitance error, where n is greater than or equal to one.

5. The method of claim 1, further comprising:
   determining that the signal provided, by the VCO has a third frequency different than the target frequency after adjusting the capacitor circuit based on the relative capacitance change and before performing the search;
   determining a second relative capacitance change associated with the third frequency and the target frequency from the look-up table; and
   re-adjusting the capacitor circuit based on the second relative capacitance change in order to tune from the third frequency to the target frequency.

6. The method of claim 1, further comprising:
   determining that the signal provided by the VCO has a third frequency different than the target frequency after adjusting the capacitor circuit based on the relative capacitance change and before performing the search, and that a difference between the third frequency and the target frequency is greater than the threshold; and
   determining whether the third frequency is greater than or less than the target frequency, 7. The method of claim 6, wherein when the third frequency is less than target frequency, the method further comprises:
   determining a second relative capacitance change associated with a fourth frequency higher than the third frequency from the look-up table; and
   re-adjusting the capacitor circuit based on the second relative capacitance change.

8. The method of claim 7, wherein the capacitor circuit comprises a first capacitor circuit and a second capacitor circuit, wherein the adjusting and the re-adjusting are performed using the first capacitor circuit, and wherein performing the search includes adjusting the second capacitor circuit.

9. The method of claim 6, wherein when the third frequency is greater than the target frequency, the method further comprises refraining from re-adjusting the capacitor circuit based on the look-up table.

10. The method of claim 9, wherein the capacitor circuit comprises a first capacitor circuit and a second capacitor circuit, wherein the adjusting is performed using the first capacitor circuit, and wherein performing the search includes adjusting the second capacitor circuit.

11. The method of claim 1, further comprising:
    determining a process variation associated with the capacitor circuit; and
    adjusting the relative capacitance based on the process variation, wherein the capacitor circuit is adjusted based on the adjusted relative capacitance.

12. The method of claim 1, wherein the relative capacitance change for tuning from the first frequency to the target frequency is determined based on a polynomial-based equation determined from table values in the look-up table.

13. The method of claim 12, wherein the relative capacitance change for tuning from the first frequency to the target frequency is determined by utilizing a stored polynomial coefficient extracted from the polynomial-based equation.

14. The method of claim 1, wherein the look-up table stores multiple entries that are associated with channels and target channels, and wherein the look-up table is accessed based on a first channel corresponding to the first frequency and further based on a target channel corresponding to the target frequency.

15. The method of claim 14, wherein the relative capacitance change is an amount by which a capacitance of the capacitor circuit is to be modified to tune the VCO from the first channel to the target Channel.

16. The method of claim 14, wherein a first subset of the multiple entries indicate positive relative capacitance changes, and wherein a second subset of the multiple entries indicate negative relative capacitance changes.

17. An apparatus for operating a voltage controlled oscillator (VCO), the apparatus comprising:
   means for storing an entry in a look-up table, the entry indicating a relative capacitance change associated with a first frequency and a target frequency;
   means for adjusting a capacitor circuit in the VCO based on the relative capacitance change;
   means for determining, after adjusting the capacitor circuit, that a signal provided by the VCO has a second frequency that is different than the target frequency; and
   means for performing a search to further adjust the capacitance when a difference between the second frequency and the target frequency is greater than a threshold.

18. The apparatus of claim 17, further comprising means for adjusting a fine tuning capacitor circuit in order to tune from the second frequency to the target frequency when the difference between the second frequency and the target frequency is less than the threshold.

19. The apparatus of claim 17, further comprising:
   means for determining that the signal provided by the VCO has a third frequency that differs from the target frequency by less than the threshold while performing the search; and
   means for adjusting a fine tuning capacitor circuit in order to tune from the third frequency to the target frequency after the determination that the third frequency differs from the target frequency by less than the threshold.

20. The apparatus of claim 17, further comprising:
   means for determining the difference between the second frequency and the target frequency; and
   means for determining a capacitance error based on the difference by utilizing the look-up table,
   wherein the search is performed with a capacitance search range greater than or equal to n times the capacitance error, where n is greater than or equal to one.

21. The apparatus of claim 17, further comprising:
   means for determining that the signal provided by the VCO has a third frequency different than the target frequency after adjusting the capacitor circuit based on the relative capacitance change and before performing the search;
   means for determining a second relative capacitance change associated with the third frequency and the target frequency from the look-up table; and
   means for re-adjusting the capacitor circuit based on the second relative capacitance change in order to tune from the third frequency to the target frequency.

22. The apparatus of claim 17, further comprising:
   means for determining that the signal provided by the VCO has a third frequency different than the target frequency after adjusting the capacitor circuit based on the relative capacitance change and before performing the search, and that a difference between the third frequency and the target frequency is greater than the threshold; and
   means for determining whether the third frequency is greater than or less than the target frequency.

23. The apparatus of claim 22, further comprising:
   means for determining a second relative capacitance change associated with a fourth frequency higher than the third frequency from the look-up table When the third frequency is less than the target frequency; and
   means for re-adjusting the capacitor circuit based on the second relative capacitance change.

24. The apparatus of claim 23, wherein the capacitor circuit comprises a first capacitor circuit and a second capacitor circuit, and wherein the adjusting and the re-adjusting are performed using the first capacitor circuit.

25. The apparatus of claim 22, further comprising means for refraining from re-adjusting the capacitor circuit based on the look-up table when the third frequency is greater than the target frequency.

26. The apparatus of claim 25, wherein the capacitor circuit comprises a first capacitor circuit and a second capacitor circuit, and wherein the adjusting is performed using the first capacitor circuit.

27. The apparatus of claim 17, further comprising:
   means for determining a process variation associated with the capacitor circuit; and
   means for adjusting the relative capacitance based on the process variation,
   wherein the capacitor circuit is adjusted based on the adjusted relative capacitance.

28. The apparatus of claim 17, wherein the relative capacitance change for tuning from the first frequency to the target frequency is determined based on a polynomial-based equation determined from table values in the look-up table.

29. The apparatus of claim 28, wherein the relative capacitance change for tuning from the first frequency to the target frequency is determined by utilizing a stored polynomial coefficient extracted from the polynomial-based equation.

30. The apparatus of claim 17, further comprising a processing system into which the means for storing, the means for adjusting, the means for determining, and the means for performing are integrated.

31. An apparatus for operating a voltage controlled oscillator (VCO), the apparatus comprising:
   a processing system configured to:
      access an entry of a look-up table, the entry indicating a relative capacitance change associated with a first frequency and a target frequency;
      adjust a capacitor circuit in the VCO based on the relative capacitance change;
      after adjusting the capacitor circuit, determine that a signal provided by the VCO has a second frequency that is different than the target frequency; and
      perform a search to farther adjust the capacitor circuit when a difference between the second frequency and the target frequency is greater than a threshold.

32. The apparatus of claim 31, further comprising the VCO, wherein the VCO is coupled to the processing system.

33. The apparatus of claim 31, wherein the processing system is further configured to:

determine that the signal provided by the VCO has a third frequency that differs from the target frequency by less than the threshold while performing the search; and adjust a fine tuning capacitor circuit in order to tune from the third frequency to the target frequency after the determination that the third frequency differs from the target frequency by less than the threshold.

34. The apparatus of claim 31, wherein the processing system is further configured to:
determine the difference between the second frequency and the target frequency; and
determine a capacitance error based on the difference by utilizing the look-up table,
wherein the search is performed with a capacitance search range greater than or equal to n times the capacitance error, where n is greater than or equal to one.

35. The apparatus of claim 31, wherein the processing system is further configured to:
determine that the signal provided by the VCO has a third frequency different than the target frequency after adjusting the capacitor circuit based on the relative capacitance change and before performing the search;
determine a second relative capacitance change associated with the third frequency and the target frequency from the look-up table; and
re-adjust the capacitor circuit based on the second relative capacitance change in order to tune from the third frequency to the target frequency.

36. The apparatus of claim 31, wherein the processing system is further configured to:
determine that the signal provided by the VCO has a third frequency different than the target frequency after adjusting the capacitor circuit based on the relative capacitance change and before performing the search, and that a difference between the third frequency and the target frequency is greater than the threshold; and
determine whether the third frequency is greater than or less than the target frequency.

37. The apparatus of claim 36, wherein when the third frequency is less than the target frequency, the processing system is further configured to:
determine a second relative capacitance change associated with a fourth frequency higher than the third frequency from the look-up table; and
re-adjust the capacitor circuit based on the second relative capacitance change.

38. The apparatus of claim 37, wherein the capacitor circuit comprises a first capacitor circuit and a second capacitor circuit, and wherein the adjusting and the re-adjusting are performed using the first capacitor circuit.

39. The apparatus of claim 36, wherein when the third frequency is greater than the target frequency, and the processing system is further configured to refrain from re-adjusting the capacitor circuit based on the look-up table.

40. The apparatus of claim 39, wherein the capacitor circuit comprises a first capacitor circuit and a second capacitor circuit, and wherein the adjusting is performed using the first capacitor circuit.

41. The apparatus of claim 31, wherein the processing system is further configured to:
determine a process variation associated with the capacitor circuit; and
adjust the relative capacitance based on the process variation,
wherein the capacitor circuit is adjusted based on the adjusted relative capacitance.

42. The apparatus of claim 31, wherein the relative capacitance change for tuning from the first frequency to the target frequency is determined based on a polynomial-based equation determined from table values in the lookup table.

43. The apparatus of claim 42, wherein the relative capacitance change for tuning from the first frequency to the target frequency is determined by utilizing a stored polynomial coefficient extracted from the polynomial-based equation.

44. An apparatus comprising:
a first capacitive circuit of a voltage-controlled oscillator (VCO), the first capacitive circuit configured to adjust a capacitance associated with the VCO based on an entry retrieved from a look-up table, the entry indicating a relative capacitance change associated with a first frequency and a target frequency; and
a second capacitive circuit of the VCO, the second capacitive circuit configured to further adjust the capacitance.

45. The apparatus of claim 44, wherein the first capacitive circuit includes a first bank of capacitors each having a common capacitance.

46. The apparatus of claim 45, wherein the first capacitive circuit further includes a second bank of capacitors including binary weighted capacitances.

47. The apparatus of claim 46, further comprising a processing device coupled to the VCO, wherein the processing device is configured to instruct the first capacitive circuit and the second capacitive circuit to adjust the capacitance associated with the VCO.

48. The apparatus of claim 47, wherein the processing device is further configured to adjust the first bank of capacitors in connection with a predictive search and to adjust the second bank of capacitors in connection with a binary search performed after the predictive search.

49. The apparatus of claim 44, wherein the first capacitive circuit is further configured to enable a coarse adjustment of the capacitance, and wherein the second capacitive circuit is further configured to enable a fine adjustment of the capacitance.

50. The apparatus of claim 44, wherein the second capacitive circuit includes one Or more varactors.

51. The apparatus of claim 44, further comprising a set of transistors configured to selectively enable capacitors of the first capacitive circuit.

52. The apparatus of claim 44, further comprising an inductor, wherein the inductor, the first capacitive circuit, and the second capacitive circuit form a tank circuit of the VCO.

53. The apparatus of claim 52, wherein the inductor, the first capacitive circuit, and the second capacitive circuit are coupled in parallel.

* * * * *